(12) United States Patent
Danak et al.

(10) Patent No.: US 9,203,500 B2
(45) Date of Patent: Dec. 1, 2015

(54) METHOD AND APPARATUS FOR CALIBRATING AN ITERATIVE MATCHING NETWORK TUNER

(71) Applicant: BlackBerry Limited, Waterloo (CA)

(72) Inventors: Amir Danak, Waterloo (CA); Shirook M. H. Ali, Waterloo (CA); James Warden, Waterloo (CA)

(73) Assignee: BLACKBERRY LIMITED, Waterloo, Ontario (CA)

( * ) Notice: Subject to any disclaimer, the term of this patent is extended or adjusted under 35 U.S.C. 154(b) by 259 days.

(21) Appl. No.: 13/900,151

(22) Filed: May 22, 2013

(65) Prior Publication Data
US 2014/0349593 A1   Nov. 27, 2014

(51) Int. Cl.
| | | |
|---|---|---|
| *H04B 1/40* | (2015.01) | |
| *H04B 7/12* | (2006.01) | |
| *H03H 7/40* | (2006.01) | |
| *H04B 1/04* | (2006.01) | |
| *H04B 17/12* | (2015.01) | |

(52) U.S. Cl.
CPC . *H04B 7/12* (2013.01); *H03H 7/40* (2013.01); *H04B 1/0458* (2013.01); *H04B 1/40* (2013.01); *H04B 17/12* (2015.01)

(58) Field of Classification Search
CPC ....... H04B 1/0458; H04B 1/0475; H04B 1/40
USPC .......... 455/63.1, 67.11, 67.13, 77, 78, 82, 83
See application file for complete search history.

(56) References Cited

U.S. PATENT DOCUMENTS

| | | | |
|---|---|---|---|
| 7,548,762 B2 * | 6/2009 | Fabrega-Sanchez et al. | 455/556.1 |
| 8,190,109 B2 | 5/2012 | Ali et al. | |
| 8,204,446 B2 * | 6/2012 | Scheer et al. | 455/67.11 |
| 8,217,732 B2 | 7/2012 | McKinzie | |
| 8,253,421 B2 | 8/2012 | Oikawa | |
| 2011/0053524 A1 | 3/2011 | Manssen | |
| 2011/0086598 A1 | 4/2011 | Ali et al. | |
| 2011/0086601 A1 | 4/2011 | Ali et al. | |
| 2012/0169351 A1 | 7/2012 | Simpson | |

* cited by examiner

*Primary Examiner* — Quochien B Vuong
(74) *Attorney, Agent, or Firm* — Guntin & Gust, PLC; Andrew Gust

(57) ABSTRACT

A system that incorporates teachings of the subject disclosure may include, for example, identifying a usage mode of the communication device, running a calibration session that includes adjusting a starting point for tuning of the matching network based on a categorized history of previous tuning search paths and based on the usage mode where the categorized history of previous tuning search paths is generated based on monitoring previous tuning search paths during previous tuning and based on monitoring previous usage modes during the previous tuning, and adjusting a tuning search path for the tuning of the matching network based on the categorized history of previous tuning search paths and the usage mode where the adjusting of the starting point and the adjusting of the tuning search path reduces a tuning search time and provides a unique solution for the tuning. Other embodiments are disclosed.

20 Claims, 15 Drawing Sheets

LOOK-UP TABLE

| Band 1; Use Case 1; Desired tuning state |
|---|
| Band 1; Use Case 2; Desired tuning state |
| ⋮ |
| Band 1; Use Case n; Desired tuning state |
| Band 2; Use Case 1; Desired tuning state |
| Band 2; Use Case 2; Desired tuning state |
| ⋮ |
| Band 2; Use Case n; Desired tuning state |
| Band N; Use Case 1; Desired tuning state |
| Band N; Use Case 2; Desired tuning state |
| ⋮ |
| Band N; Use Case n; Desired tuning state |

METHOD AND APPARATUS FOR CALIBRATING AN ITERATIVE MATCHING NETWORK TUNER

FIELD OF THE DISCLOSURE

The subject disclosure relates to a method and apparatus for calibrating an iterative matching network tuner.

BACKGROUND

Portable wireless devices, such as smart phones and tablets, have antennas incorporated into their industrial designs. These antennas can be multi-band, operating on multiple frequency bands such as in the range of 700 MHz to 2690 MHz. It is expected that many more frequency bands will be implemented in portable devices in order to ease the capacity congestion of the wireless cellular frequency bands. Impedance matching over a large range of Radio Frequency (RF) bandwidth becomes increasingly more challenging as the number of supported bands increases.

Tunable components present a viable approach to antenna system design, which is ever more complex due to the growing list of operating frequencies and the increasing diversity and use cases of portable wireless devices. A primary application of such elements is in tunable matching networks, to compensate the power loss associated with the time-varying impedance mismatch in different operation modes of the device. In case of a wireless handheld device, the antenna impedance as seen by the transceiver varies when the user takes his device out of holster, sends a text message, watches a video, answers a phone call, and so on. A matching network can be tuned in an effort to reduce these impedance variations seen by the transceiver and hence improve the antenna performance. However, the tuning process can be improved such as to avoid undesired tuning search times.

BRIEF DESCRIPTION OF THE DRAWINGS

Reference will now be made to the accompanying drawings, which are not necessarily drawn to scale, and wherein:

FIG. 18 depicts an illustrative embodiment of a look-up table utilized by a communication device for controlling tunable reactive elements utilized by the communication device;

DETAILED DESCRIPTION

Figure 1:
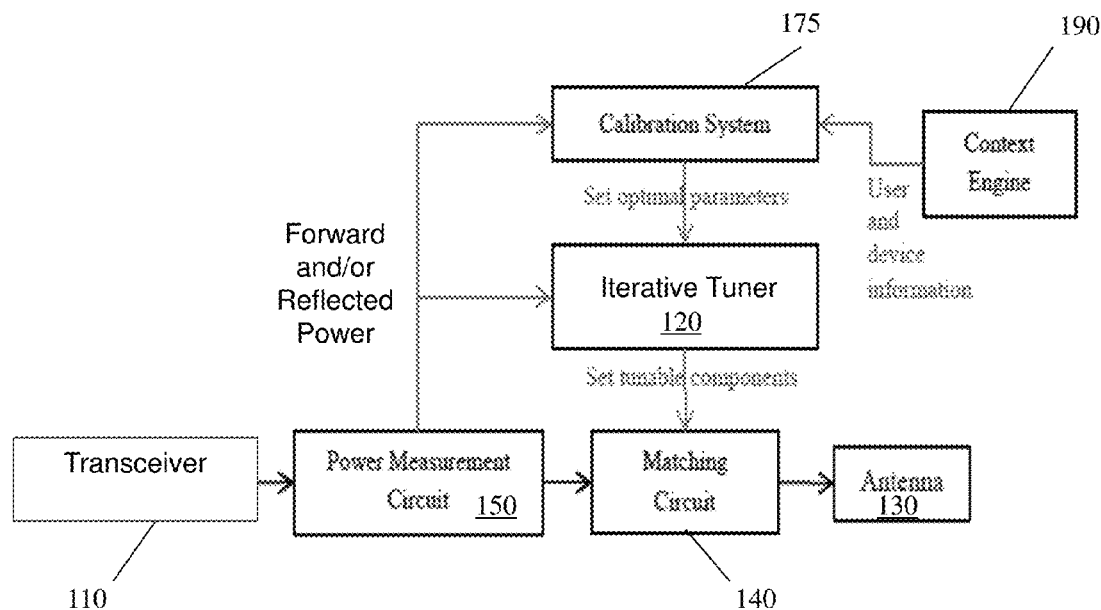
FIG. 1 depicts an illustrative embodiment of a communication device having an iterative tuner and a calibration system for the tuner.

The subject disclosure describes, among other things, illustrative embodiments for impedance matching for communication devices. The exemplary embodiments can provide calibrating control methods and apparatus used for improving tuning of a matching network in an antenna system based on actual user application. In one or more embodiments, the calibration process can run in the background and does not impose time or computational complexity on the closed-loop tuning process. One or more of the exemplary embodiments can monitor the state of a user and/or a device, and can incrementally configure the iterative tuner (which may be optimized for average users and devices) to enhance performance for actual user, device, and/or environment settings. In one or more embodiments, calibration can be performed based on computing the actual impedance of the antenna using the same set of power measurements obtained for iterative tuning of the matching network. The tuning process can be optimized based on the history of previous adjustments using an external calibrating system.

One or more of the exemplary embodiments can provide for a calibration of the tuning search method where a history of previous search paths is stored and is categorized based on a usage mode(s) of the communication device. With this history, the initial starting point and/or the search path in the tuning cycle can be adjusted (e.g., optimized), which can reduce the search time and/or ensure a unique solution for the tuning algorithm. Calibration can include changing the initial (starting) point and/or the search path so that the system does not always start from the same initial conditions, but starts based on a stored tuning history mapped to or otherwise indexed by usage mode(s) of the communication device.

One or more of the exemplary embodiments can identify a usage mode of a communication device, adjust a starting point for tuning of a matching network based on a categorized history of previous tuning search paths and based on the usage mode where the categorized history of previous tuning search paths is generated based on monitoring previous tuning search paths during previous tuning and based on monitoring previous usage modes during the previous tuning, and adjust a tuning search path for the tuning of the matching network based on the categorized history of previous tuning search paths and the usage mode where the adjusting of the starting point and the adjusting of the tuning search path reduces a tuning search time and provides a unique solution for the tuning.

One embodiment of the subject disclosure is a communication device including an antenna; a transceiver coupled with the antenna; a matching network including variable reactance elements where the matching network is coupled with the antenna and the transceiver; and a calibrating system (controller) coupled with the matching network. The controller performs operations including computing or retrieving s-parameters for the matching network when the matching network is tuned to any two tuning states. The controller can monitor for a solution for an antenna impedance based on the reflected power, the forward power, and the s-parameters of two tuning states, where the monitor for the solution is further based on the solution being: a unique solution, one of a pair of solutions wherein the other solution is not admissible, or one of a pair of solutions which is in neighborhood of one or more solution points from previous tuning steps. The controller, responsive to identifying the solution, can adjust tuning of the matching network based on the solution for antenna impedance. These adjustments can be in various forms, including changing a starting point, changing step sizes, changing triggering conditions, and so forth.

One embodiment of the subject disclosure is a method including computing, by the processor, s-parameters for the matching network when the matching network is tuned to two tuning states. The method can also include retrieving s-parameters from tables, populated offline for the tuning range of matching network elements. The method includes monitoring for a solution for the antenna impedance based on the reflected power, the forward power, and the s-parameters of two tuning states. The method includes, responsive to a determination that a solution comprises a pair of solutions, determining reflected power and forward power when the matching network is tuned to a new tuning state; computing or retrieving additional s-parameters for the matching network when the matching network is tuned to the new tuning state; calculating additional solutions based on the reflected power, the forward power, and the s-parameters associated with the new tuning state; generating an averaged solution by averaging the admissible solutions obtained in current and previous tuning steps; and calibrating tuning of the matching network based on the averaged solution.

One embodiment of the subject disclosure includes a non-transitory computer-readable storage medium comprising computer instructions which, responsive to being executed by a processor of a communication device, cause the processor to perform operations including determining a plurality of reflected power and a plurality of forward power for a plurality of tuning states of a matching network of the communication device. The processor can compute s-parameters for the matching network when the matching network is tuned to each of the plurality of tuning states, or retrieve them from tables populated offline for the tuning range of matching network elements. The processor can monitor for a solution for an antenna impedance based on the plurality of reflected power, the plurality of forward power, and the s-parameters. The monitoring for the solution is further based on the solution being: a unique solution, one of a pair of solutions wherein the other solution is not admissible, or one of a pair of solutions which is in the neighborhood of one or more solution points from previous tuning steps. The processor, responsive to identifying the solution, can adjust tuning of the matching network based on the solution.

Other embodiments are described by the subject disclosure.

One or more of the exemplary embodiments can utilize matching networks that include variable reactance elements, such as one or more voltage tunable dielectric capacitors, one or more Micro-Electro-Mechanical Systems (MEMS) varactors, one or more semiconductor varactors, one or more MEMS switched reactance component, one or more semiconductor switched reactance component, or combinations thereof. The matching network can be in various configurations and can include various components including fixed and/or variable reactance elements.

In some embodiments, mismatch levels can be determined by measuring the power of partially standing waves formed as a result of partial reflection of the incident radio wave. The voltage standing wave ratio (VSWR), defined as the ratio of adjacent amplitude peaks of the standing wave, has a ratio of 1:1 for ideal transmission where the incident radio wave is fully transmitted. The VSWR increases as the antenna mismatch deteriorates. It can be obtained by comparing the power reflected from and transmitted through the antenna. Computation of the absolute VSWR can be performed by repeated sampling of the reflected and transmitted signals, which is often necessary due to limited linear measurement range of power detectors. Closed-loop iterative methods can be applied to tune the antenna based on gradual decrements of VSWR or equivalently decrements of the reflected coefficient of antenna, such as explained in U.S. Pat. No. 8,217,732 to McKinzie, the disclosure of which is hereby incorporated by reference. In iterative matching, tunable elements can be perturbed repeatedly until the desired VSWR is obtained. The performance of an iterative matching algorithm can depend on a number of factors including: the initial setup, i.e., the values of tunable elements at the start of the tuning process; the triggering and stop conditions, i.e., the maximum VSWR (e.g., 1.3:1) before tuning is required and the desired VSWR (e.g., 1.2:1) that are set differently to avoid frequent switching between the matched and unmatched states caused by common oscillations in power measurements; and/or the step size, i.e., the maximum perturbations (of tunable elements) allowed at each stage.

To provide convergence to a unique tuning set that yields the desired VSWR, the above-described parameters can conform to certain criteria associated with the algorithm chosen. For instance, a lengthy tuning process caused by a starting point far from optimum may fail if the operating mode changes before the process is complete, e.g., if the user hangs up the phone before the matching circuit is tuned. Also, a step size too small should not be chosen since it slows down the tuning process, however, the step size should not be too large as the iterative algorithm may diverge. The iterative tuning algorithm of the exemplary embodiments provide for: the tuning being completed in a desired time, in particular faster than the minimum runtime of any known use case of the device; the performance of the tuning algorithm varying based on the device, user, and/or environment characteristics.

A substantial change in impedance seen by a transceiver can result from marginal differences among devices of the same model, their users, and use cases or usage modes: each person has a unique style of texting, talking, typing, playing, etc. with his or her smartphone. (The terms use case and usage mode can be utilized interchangeably throughout the description unless stated otherwise). The usage mode can also be based on user states and/or device states, such as a user state of hand's free operation or hand-held operations and a device state such as Bluetooth® operation, where the user state and/or the device state directly or indirectly effect the impedance of the communication device (e.g., cause a change). In addition, slight differences in antenna placement, skin conductivity, grip pressure, and so on, can result in a phase shift of the antenna impedance. As a result, generic iterative tuning methods are commonly implemented as algorithms to search tables of values of tunable components, populated according to common use cases of an average user rather than based on the actual user. An iterative matching process without calibration can run as follows: at each iteration, the tunable components are modified according to a set of values chosen from a preset table. The VSWR is measured for the new setup, and if above desired level, a new set of values for tunable components is chosen according to the tuning algorithm. This process is repeated until the desired VSWR is obtained. In contrast, one or more of the exemplary embodiments can employ calibration that enables the tuning to be improved based on a number of factors, including calibration based on computing the actual impedance of the antenna using the same set of power measurements obtained for iterative tuning of the matching network, as illustrated in FIG. 1.

FIG. 1 illustrates a block diagram of a communication device 100 having a tunable matching circuit 110 with calibration. Device 100 can include a transceiver 110, an iterative tuner 120, an antenna 130, a matching circuit 140, a power measurement circuit 150, a calibration system 175 and a context engine 190. Other components and combinations of components can also be used with device 100 in place of or in addition to the components shown in FIG. 1. Device 100 can utilize the power measurement circuit 150 (e.g., a sensor and/or a directional coupler) to obtain operational metrics for the device, such as obtaining forwards and reflected power measurements. These operational metrics can be obtained at various times, such as measuring the forward and reflected power during one or more transmit modes of the device 100. In one or more embodiments, the power measurement circuit 150 can provide the operational metrics to both the iterative tuner 120 and the calibration system 175.

In one or more embodiments, context engine 190 can be utilized for determining a context of the device, such as use cases that effect the impedance including a flip open state, a slider out state, a hand's free operation state, a hand-held operation state, an ear-piece speaker operation state, a speaker-phone operation state, and so forth. The use case can be determined or otherwise identified based on a number of processes, such as mechanical sensors, user input, calculated based on changes to operational metrics, and so forth. The context engine 190 can be of various forms, such as a circuit or other electronic device or component that can perform desired functions such as determining a context of the use of the device 100 (e.g., identifying or otherwise detecting a usage mode such as a hand's free operation state or Bluetooth operation mode). The context engine 190 can be in other forms as well including a programmable device (e.g., a programmable array logic device) that can execute code or other instructions to perform desired functions, such as identifying a context of the device 100 and/or identifying changes to the context of the device 100. The context engine 190 can be a separate component that is in communication with other components of the device 100, such as a sub-processor that communicates with a main processor of the device 100 via a communications bus. The context engine 190 can also be incorporated with one or more other components of the device 100, such as being an integral part of a processor of the device 100 where the processor performs functions for the device 100 in addition to performing the function of context identification. The context engine 190 can provide the calibration system 175 with user and/or device information that can be used for adjusting available pre-determined tuning states to available tuning states that are customized to the individual user and/or the individual device. As an example, pre-determined tuning states that are based on an average user's antenna placement, skin conductivity or grip pressure can be adjusted based on the particular user's skin conductivity or grip pressure. Similarly, pre-determined tuning states that are based on an average device's antenna placement can be adjusted based on the particular antenna placement of the model of the device 100. The calibration system 175 can provide the optimal or customized parameters for the particular user and/or device to the iterative tuner 120.

Figure 2:
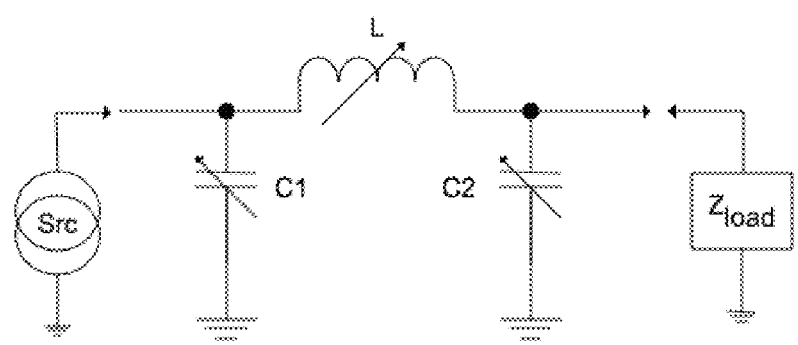
FIG. 2 depicts an illustrative embodiment of a tunable matching circuit.

The matching circuit 140 can be of various configurations and can include various components, including voltage tunable dielectric capacitors, Micro-Electro-Mechanical Systems (MEMS) varactors, semiconductor varactors, MEMS switched reactance component, semiconductor switched reactance component, or combinations thereof. The matching circuit 140 can include fixed and/or variable reactance elements. As an example, a pi network 200 shown in FIG. 2 can be used to perform impedance matching. Varying the reactance of capacitors C1, C2 and inductor L enables matching a wide range of complex impedances between the RF source (SRC) and load.

Figure 3:
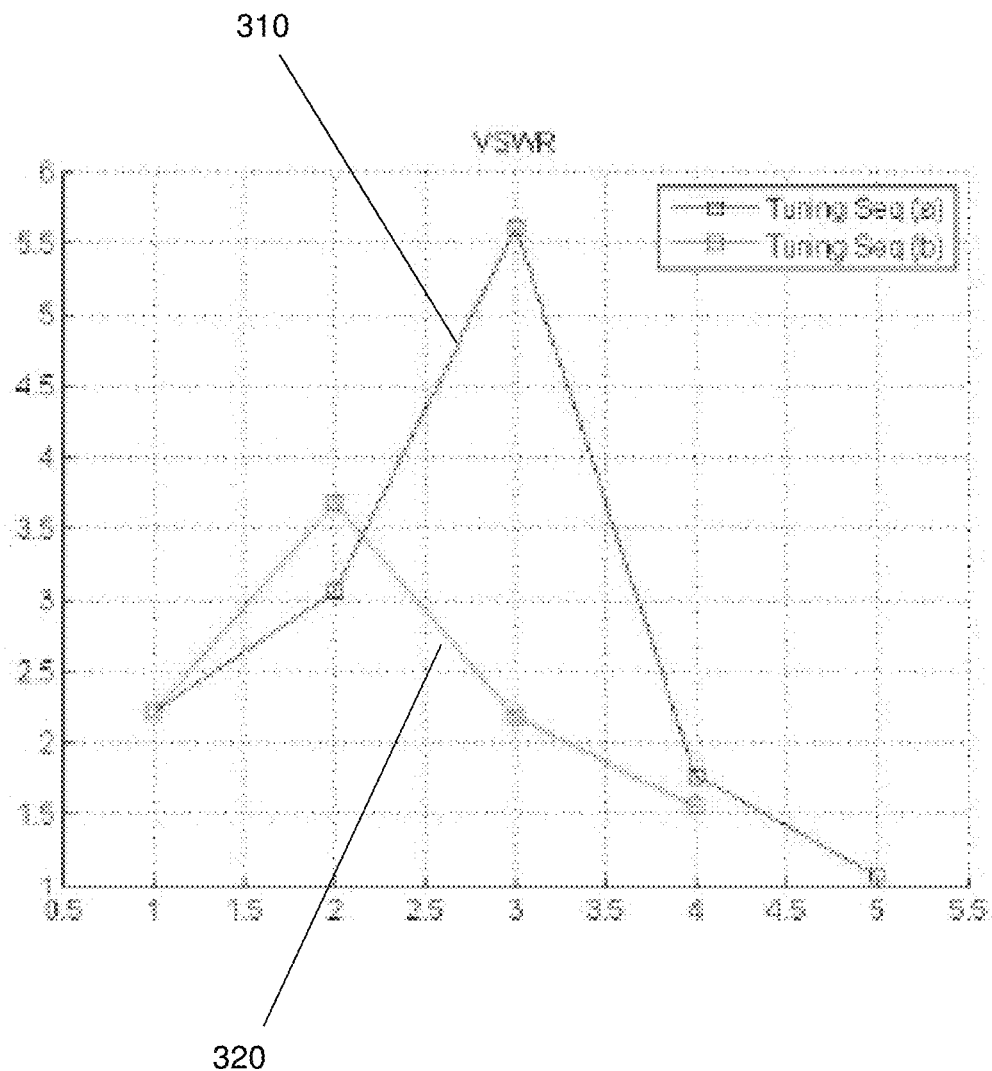
FIG. 3 depicts an exemplary graph depicting VSWR for two different tuning paths.
Figure 4:
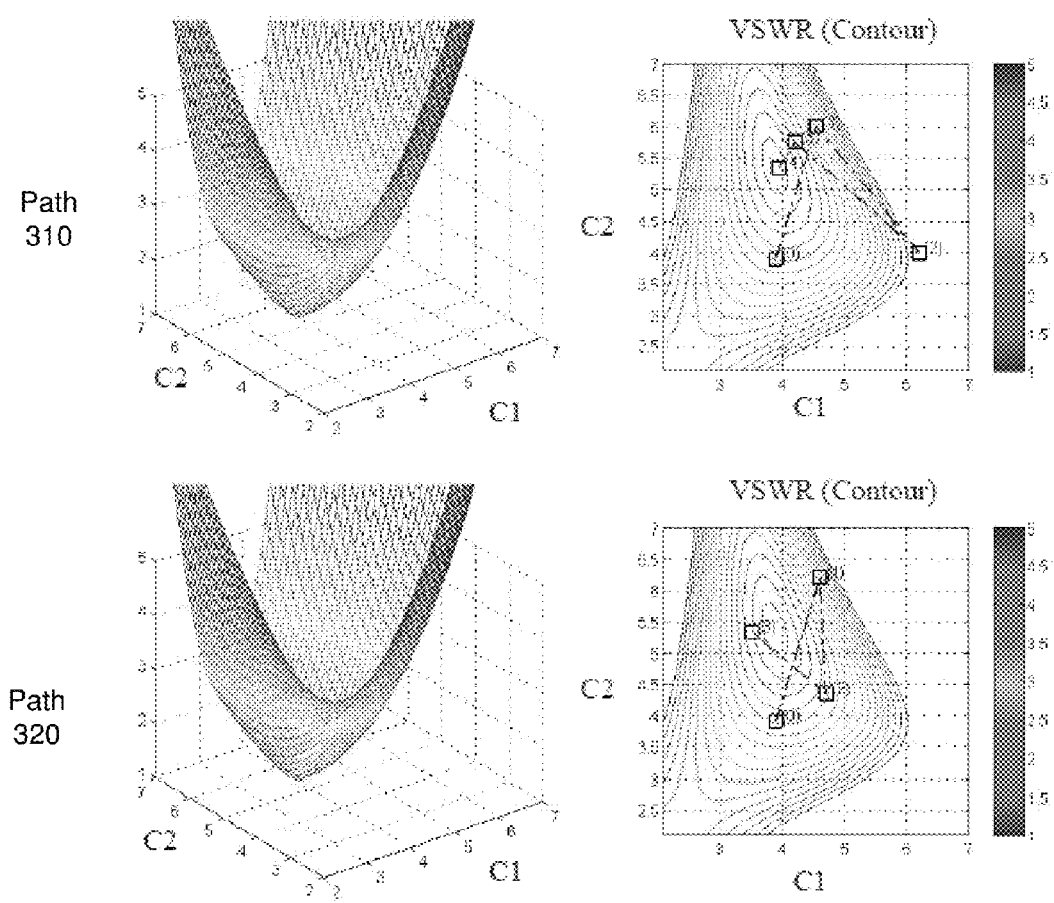
FIG. 4 depicts tuning contour maps for the tuning paths of FIG. 3.

Device 100 can improve a closed-loop iterative tuning in a number of different ways. A convergence rate of a closed-loop algorithm can be improved by device 100 by adjusting the tuning course based on previous tuning runs. For example, each tuning process consists of a series of adjustments (increments and decrements) in resistance, capacitance, and/or inductance of tunable components to achieve a desired VSWR. The calibration system 175 can configure the tuning path based on the starting point of tuning process and a history of successful adjustments. This is illustrated using the following example. Consider iterative tuning of a parallel L-C matching network with two tunable capacitors C1 and C2. Two tuning paths (310) and (320) are highlighted in FIG. 3, which represent variations in VSWR due to adjustments in C1 and C2. The antenna impedance and initial configurations are the same in both sample runs of the iterative tuning algorithm. The tuning sequences, however, are clearly different. The undesired increase in VSWR transition from stage (1) to (2) in tuning process (310) can be avoided by slight modification of initial transition (0) to (1) as depicted in path (320). The calibration system 175 can smooth the tuning path by modifying the tuner step size (adjustment level) based on the results of previous runs. This can be performed by monitoring and storing data from previous tuning runs, and analyzing the data to determine desired tuning steps. Tuning contour graphs are illustrated in FIG. 4.

Device 100 can also speed up adjustment of tunable elements using an estimate of antenna impedance. The performance of a tuning algorithm can be improved by increasing the step size of the iterative tuner 175 in a direction that agrees with the antenna impedance evaluated from previous measurements.

Device 100 can further improve tuning state estimation by incorporating user activity cues. The performance of the tuning algorithm can be improved by configuration of the initial setup associated with different use cases of device 100 given the actual antenna impedance when the user speaks, types, etc.

Device 100 can additionally improve the performance of the iterative tuner 175 by adjusting the triggering and/or stopping conditions based on previous tuning results. For example, the desired VSWR can be increased to reduce the runtime of the tuning algorithm, if needed or desired. As another example, the maximum acceptable VSWR can be increased to avoid tuning when it is not expected to substantially improve the antenna efficiency. In one or more embodiments, previous tuning data can be compiled or otherwise monitored so that the triggering and/or stopping conditions can be adjusted. For example, previous tuning can be evaluated to determine that a particular maximum acceptable VSWR results in a desired improvement of antenna efficiency. This data can then be used to establish a threshold for the maximum acceptable VSWR. Other monitoring can be performed to identify desired runtimes for the tuning algorithms, including monitoring timing data associated with particular communication sessions.

One or more of the exemplary embodiments provide a calibration session based on a sorted history from previous search paths and usage modes. The calibration can include a change in the initial (starting point) of the search and/or the search path/steps. This means that the initiation of the tuning/search does not necessarily start from the same point and/or conditions for all users and usage modes. The calibration can enable the tuning search to be improved or optimized, and can further enable providing a unique solution. One or more of the exemplary embodiments enable computing antenna impedance based on power measurements (e.g., forward and reflected power) in order to calibrate or otherwise adjust the iterative tuner. One or more these embodiments can be based on identifying the antenna impedance during a transmit mode.

Figure 5:
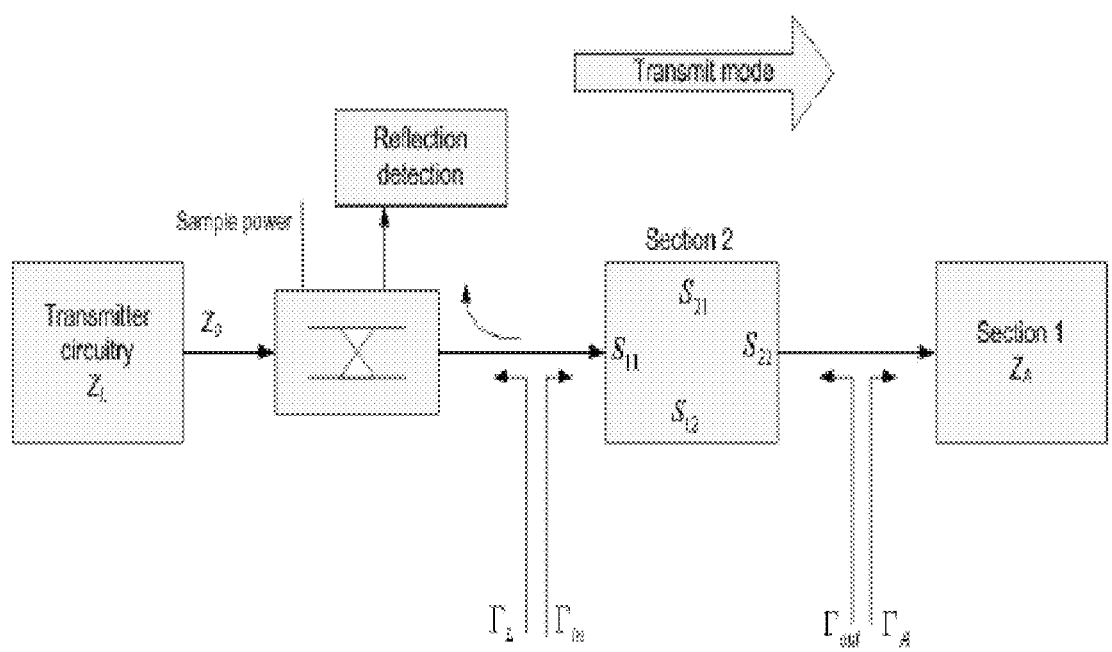
FIG. 5 depicts an illustrative embodiment of another communication device having an iterative tuner and a calibration system for the tuner.

Referring to the communication device 500 of FIG. 5, an algorithm can be utilized to analytically obtain the input impedance of any section 1 in an antenna system, given multiple power measurements made before any adjacent section 2 of the same system. In this embodiment, section 1 is an antenna in a handheld device 500, and section 2 is a tunable matching circuit that is connected to the remainder of the transmitter circuitry.

The input impedance of the antenna, $Z_A = Z_R + jZ_I$, is obtained based on measurement of the reflected power from section 2 $P_R$ and the forward power $P_F$. At least two independent measurements are required to uniquely identify the antenna impedance. This can be achieved by tuning the components x of section 2 to different values $x_{(1)}, x_{(2)}, \ldots$ and measure the associated power values. Parameters can be defined as follows:

Let $\eta^{(i)} = (x^{(i)}, P_R^{(i)}, P_F^{(i)})$ denote the i-th measurement set, i=1, 2, ..., where $P_R^{(i)}$ and $P_F^{(i)}$ denote the reflected power and forward power when the components of the matching network are tuned to $x^{(i)}$. Let $S = [S_{11}, S_{12}, S_{21}, S_{22}]$ denote the vector of S-parameters associated with section 2, and $S_{ij}^R$ and $S_{ij}^I$ denote the real and imaginary part of S-parameter $S_{ij}$, respectively. Let $S^{(i)}$ denote the vector of S-parameters associated with section 2 tuned to $x^{(i)}$. A mathematical relation can be identified between power measurements and the reflected coefficient of antenna, and similarly the VSWR, as is described in U.S. Pat. No. 8,190,109 to Ali, the disclosure of which is hereby incorporated by reference. For each set of measurements $\eta(i)$:

$$\frac{P_R^{(i)}}{P_F^{(i)}} = \left| S_{11}^{(i)} + \frac{S_{12}^{(i)} S_{12}^{(i)} \Gamma_A}{1 - S_{22}^{(i)} \Gamma_A} \right|^2 \quad \text{Equation 1}$$

where $\Theta_A = \Gamma_R + j\Gamma_I$ denote the reflected coefficient of antenna. Given the reflected coefficient $\Gamma_A$, the antenna impedance $Z_A$ is then obtained from Equation 2:

$$Z_A = Z_o \frac{1 + \Gamma_A}{1 - \Gamma_A} \quad \text{Equation 2}$$

Additional parameters can be defined as:

$$\begin{cases} f_1(S) = S_{12}^R S_{21}^R S_{11}^R - S_{12}^I S_{21}^I S_{11}^R + S_{12}^I S_{21}^R S_{11}^I + S_{12}^R S_{21}^I S_{11}^I \\ f_2(S) = S_{12}^I S_{21}^R S_{11}^R + S_{12}^R S_{11}^I S_{11}^R - S_{12}^R S_{21}^I S_{11}^I + S_{12}^I S_{21}^R S_{11}^I \end{cases} \quad \text{Equation 3}$$

and $$\begin{cases} f_d(S, P_R, P_F) = |S_{11}|^2 - P_R/P_F \\ f_c(S, P_R, P_F) = 2S_{22}^I f_d(S, P_R, P_F) - 2f_2(S) \\ f_b(S, P_R, P_F) = -2S_{22}^R f_d(S, P_R, P_F) + 2f_1(S) \\ f_a(S, P_R, P_F) = |S_{22}|^2 f_d(S, P_R, P_F) + |S_{12}|^2 |S_{21}|^2 - 2S_{22}^R f_1(S) - 2S_{22}^I f_2(S) \end{cases} \quad \text{Equation 4}$$

Figure 6:
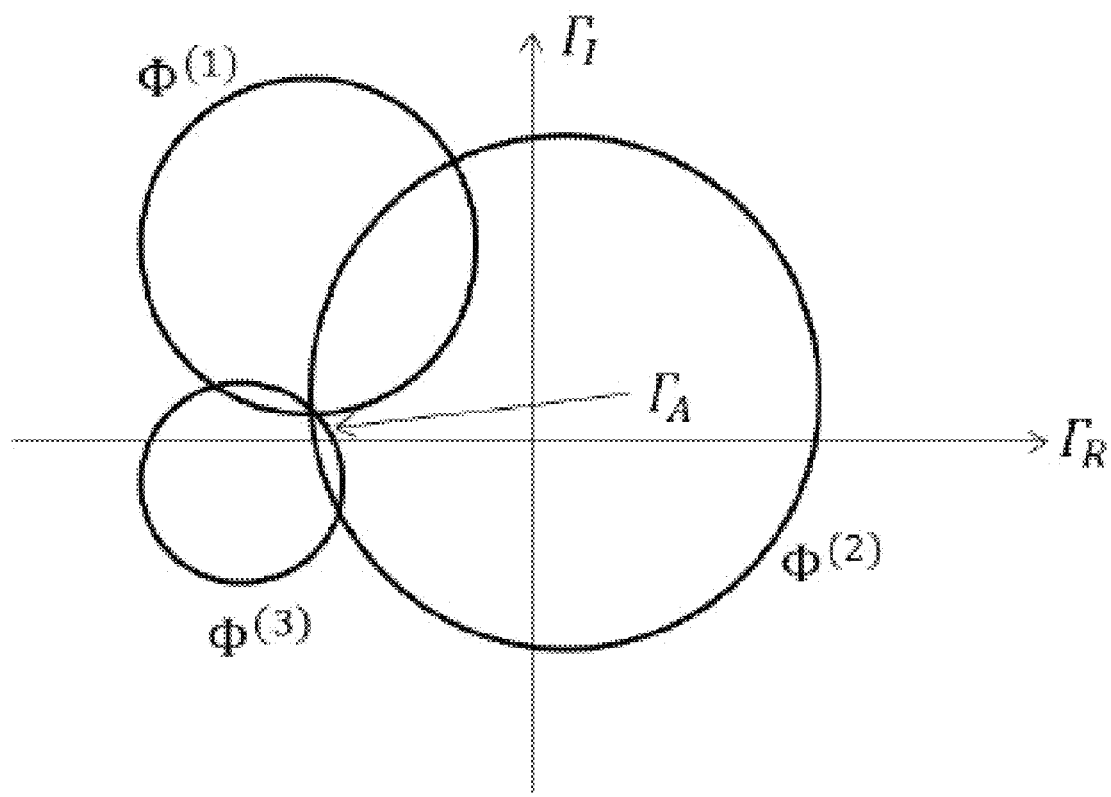
FIG. 6 depicts a graph of parameters associated with a process for determining antenna impedance based on multiple power measurements.

Equation 1 can be remodeled as a circle $\Phi^{(i)} = \langle c^{(i)}, r^{(i)} \rangle$ as illustrated in FIG. 6 where:

$$(\Gamma_R - \Gamma_R^{(i)})^2 + (\Gamma_I - \Gamma_I^{(i)})^2 = (r^{(i)})^2 \quad \text{Equation 5}$$

centered at $c^{(i)} = [\Gamma_R^{(i)}, \Gamma_I^{(i)}]$ with radius $r^{(i)}$, where $$\begin{cases} \Gamma_R^{(i)} = -f_b(S^{(i)}, P_R^{(i)}, P_F^{(i)})/(2f_a(S^{(i)}, P_R^{(i)}, P_F^{(i)})) \\ \Gamma_I^{(i)} = -f_c(S^{(i)}, P_R^{(i)}, P_F^{(i)})/(2f_a(S^{(i)}, P_R^{(i)}, P_F^{(i)})) \\ r^{(i)} = \sqrt{(\Gamma_R^{(i)})^2 + (\Gamma_I^{(i)})^2 - f_d(S^{(i)}, P_R^{(i)}, P_F^{(i)})/f_a(S^{(i)}, P_R^{(i)}, P_F^{(i)})} \end{cases} \quad \text{Equation 6}$$

In one or more embodiments, at least two measurements are obtained in order to obtain a solution and identify the input impedance of the antenna. Each pair of measurement sets $\langle \eta^{(1)}, \eta^{(2)} \rangle$ forms a set of nonlinear quadratic equations:

$$\begin{cases} (\Gamma_R - \Gamma_R^{(1)})^2 + (\Gamma_I - \Gamma_I^{(1)})^2 = (r^{(1)})^2 \\ (\Gamma_R - \Gamma_R^{(2)})^2 + (\Gamma_I - \Gamma_I^{(2)})^2 = (r^{(2)})^2 \end{cases} \quad \text{Equation 7}$$

For each pair of measurements $\langle \eta^{(1)}, \eta^{(2)} \rangle$, The set of Equations (7) can be solved to obtain the reflected coefficient of antenna $\Gamma_A$. For =1, 2, a further parameter can be defined:

$$\begin{cases} a_i = f_a(S^{(i)}, P_R^{(i)}, P_F^{(i)}) \\ b_i = f_b(S^{(i)}, P_R^{(i)}, P_F^{(i)}) \\ c_i = f_c(S^{(i)}, P_R^{(i)}, P_F^{(i)}) \\ d_i = f_d(S^{(i)}, P_R^{(i)}, P_F^{(i)}) \end{cases} \quad \text{Equation 8}$$

From Equations (7):

$$\Gamma_I = k_1 \Gamma_R + k_2 \quad \text{Equation 9}$$

where $$\begin{cases} k_1 = (a_2 b_1 - a_1 b_2)/(a_1 c_2 - a_2 c_1) \\ k_2 = (a_2 d_1 - a_1 d_2)/(a_1 c_2 - a_2 c_1) \end{cases} \quad \text{Equation 10}$$

Accordingly, $$l_1(\Gamma_R)^2 + l_2 \Gamma_R + l_3 = 0 \quad \text{Equation 11}$$

where $$\begin{cases} l_1 = a_1(1 + k_1^2) \\ l_2 = a_1(2k_1 k_2) + c_1 k_1 + b_1 \\ l_3 = a_1 k_2^2 + c_1 k_2 + d_1 \end{cases} \quad \text{Equation 12}$$

Another parameter can be defined as:

$$\Delta = l_2^2 - 4 l_1 l_3 \quad \text{Equation 13}$$

For the set of Equations 7:
Case 1) Has no solution if $\Delta < 0$,
Case 2) Has a unique solution if $\Delta = 0$
Case 3) Has two solutions if $\Delta > 0$ In Cases 2 and 3, the value of $\Gamma_R$ can be obtained by solving Equation 11. The value of $\Theta_I$ can then be obtained from Equation 7. Accordingly, given the reflected coefficient of antenna $\Gamma_A=\Gamma_R+j\Gamma_I$, the input impedance of antenna can be obtained from Equation 2. An analytical process 700 for identifying antenna impedance based on two power measurements in a transmit mode is summarized as follows:

1. Input two sets of measurements $\eta^{(1)}=(x^{(1)}, P_R^{(1)}, P_F^{(1)})$ and $\eta^{(2)}=(x^{(2)}, P_R^{(2)}, P_F^{(2)})$;
2. Compute the S-parameters $S^{(1)}$ and $S^{(2)}$ associated with the components of section 2 tuned to $x^{(1)}$ and $x^{(2)}$ respectively;
3. Compute the parameters $<a_1, b_1, c_1, d_1>$ and $<a_2, b_2, c_2, d_2>$ from Equations 8, 4 and 3;
4. Compute the parameters $<k_1, k_2>$ from Equation 10;
5. Compute the parameters $<l_1, l_2, l_3>$ from Equation 12;
6. Compute $\Delta$ from Equation 13;
7. If $\Delta<0$, quit;
8. Solve Equation 11 for $\Gamma_R$;
9. Compute $\Gamma_I$ from Equation 9; and
10. Compute the input impedance of antenna $Z_A$ from Equation 2 for $\Gamma_A=\Gamma_R+j\Gamma_I$.

As illustrated in FIG. 6, the input impedance of the antenna can be uniquely identified using enough number of power measurements (e.g., two or more). The reflected coefficient of antenna $\Gamma_A$ can be obtained as the intersection of three circles $\Phi^{(1)}$, $\Phi^{(2)}$, and $\Phi^{(3)}$ representing the nonlinear quadratic Equation 5 associated with measurement sets $\eta^{(1)}$, $\eta^{(2)}$, and $\eta^{(3)}$.

Figure 7:
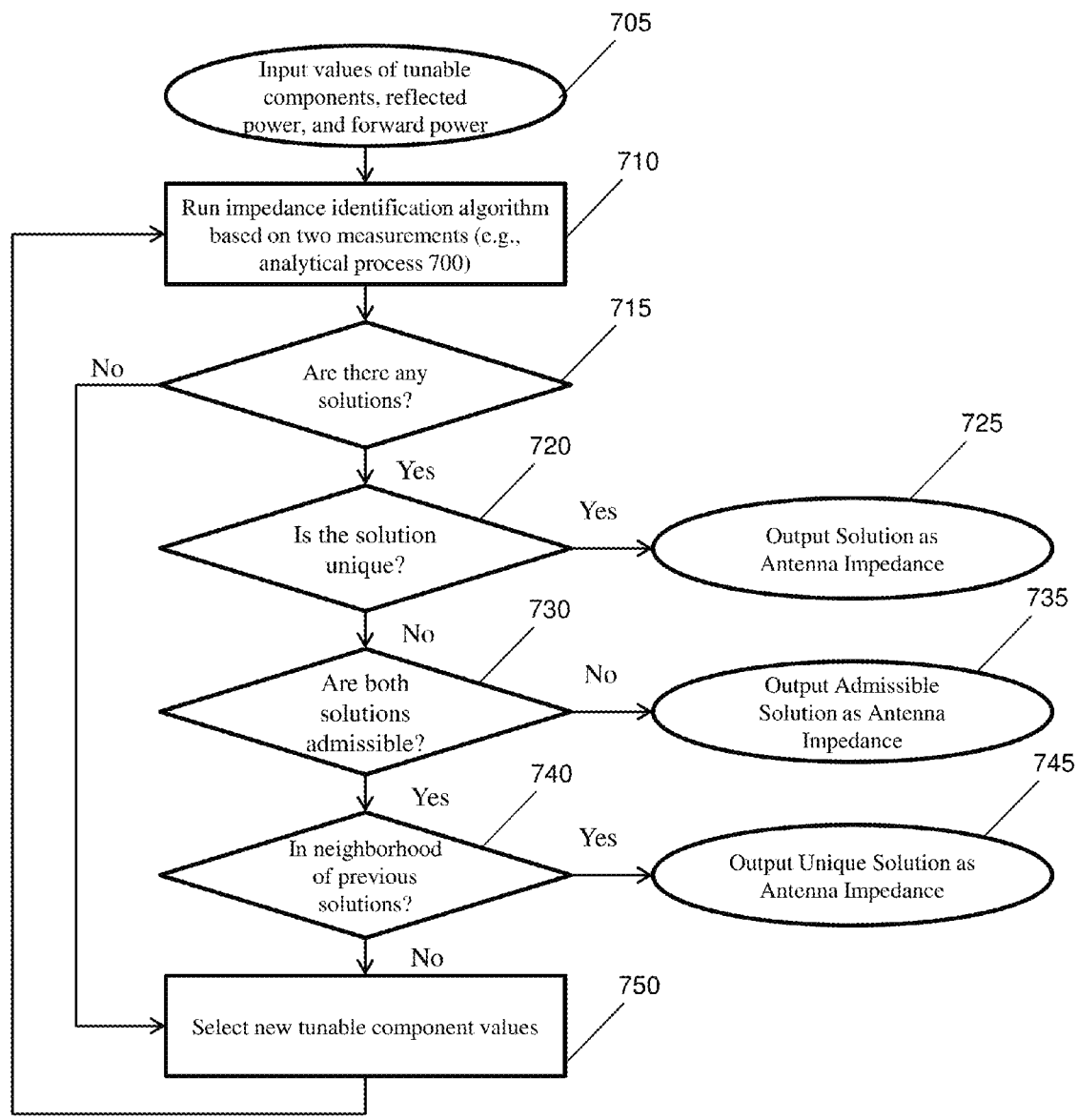
FIG. 7 depicts an exemplary method that can be used for determining antenna impedance and calibrating an iterative tuner for a matching network.

Referring to FIG. 7, a method 701 for identifying an antenna input impedance of a communication device (e.g., a handheld mobile phone) is illustrated. Method 701 enables uniquely determining the antenna impedance based on additional power measurements, so that the antenna impedance can further be utilized for calibrating an iterative tuner.

Method 701 can begin at 705 preset values can be input for the tunable components (e.g., variable capacitors or inductors). At 710, an impedance identification algorithm, such as analytical process 700 described above, can be executed based on a plurality of measurements (e.g., first and second forward and reflected power measurements). At 715, a determination can be made as to whether any solutions exist for process 700 for these measurements. If there are no solutions, then method 701 can advance to 750 to pick new tuning values for the tunable component(s). If solution(s) exist, then a determination can be made as to whether a single unique solution exists at 720. If the solution is unique then at 725, the unique solution can be output as the antenna impedance (e.g., to be utilized for calibration of the iterative tuner).

If a unique solution does not exist then a determination can be made at 730 as to whether both solutions are admissible. If only one of the solutions is admissible then at 735 the admissible solution of the pair of solutions can be output as the antenna impedance. If both solutions are admissible then at 740 a determination can be made as to whether one of the solutions is the same solution as in a previous tuning step. If one of the solutions is the same as a previous tuning solution then at 745 the other solution (which is unique as compared to previous tuning steps) can be output as the antenna impedance. If neither of the admissible solutions are the same as in a previous tuning step then a new tunable component values can be selected at 750 and the method 701 can be repeated beginning from step 710. Method 701 also allows an iterative tuner to be calibrated based on a history of previous tuning search data, such as a history of search paths that are mapped or otherwise categorized according to one or more usage modes of a communication device. The calibrating of the iterative tuner provides for different initial starting points and/or different search paths to be utilized (based on a mapping of an identified usage mode(s) to tuning data in a table of previous tuning search data) so that the search time can be reduced and/or a unique solution can be found for tuning.

Example

Figure 8:
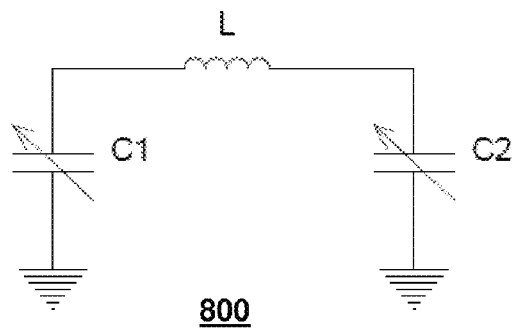
FIG. 8 depicts another illustrative embodiment of a tunable matching circuit.
Figure 9:
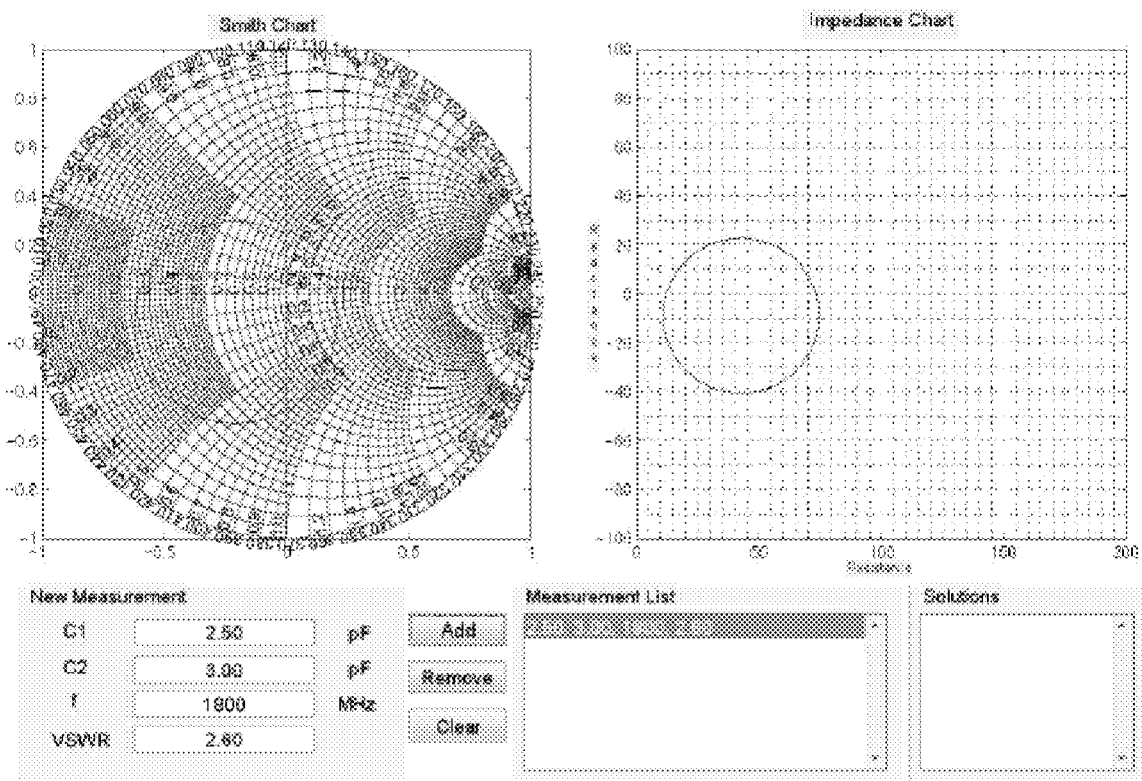
FIGS. 9-11 depict a representation of measurement sets in impedance and smith charts.

Method 701 (utilizing process 700) can be run on various matching networks, such as a tunable Pi matching network shown in FIG. 8. In this example, the inductor value is fixed at L=3.3 nH and the capacitors are tunable within the range of 2.40-6.80 pF. FIG. 9 depicts the representation of the measurement sets $\eta^{(1)}$:C1=2.5 pF, C2=3.0 pF, VSWR=2.6:1 in impedance and smith charts. The measurement set can correspond to a circle in the impedance chart, representing possible values of antenna impedance.

Figure 10:
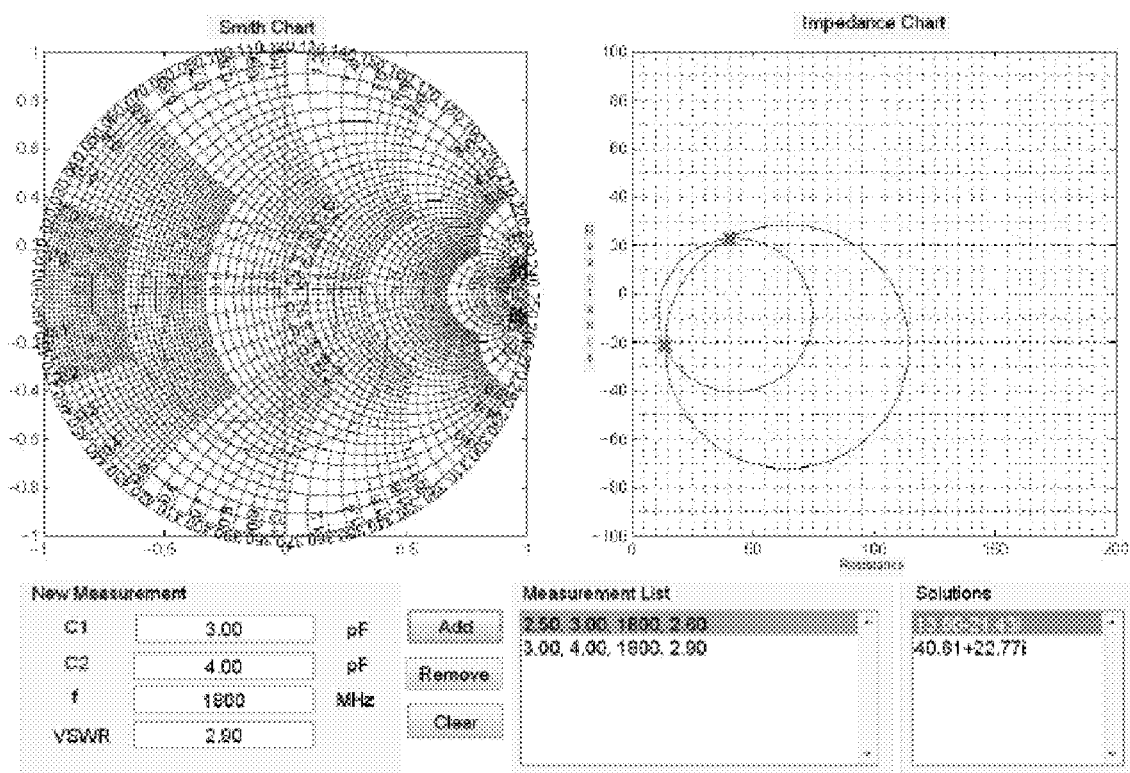
Figure 11:
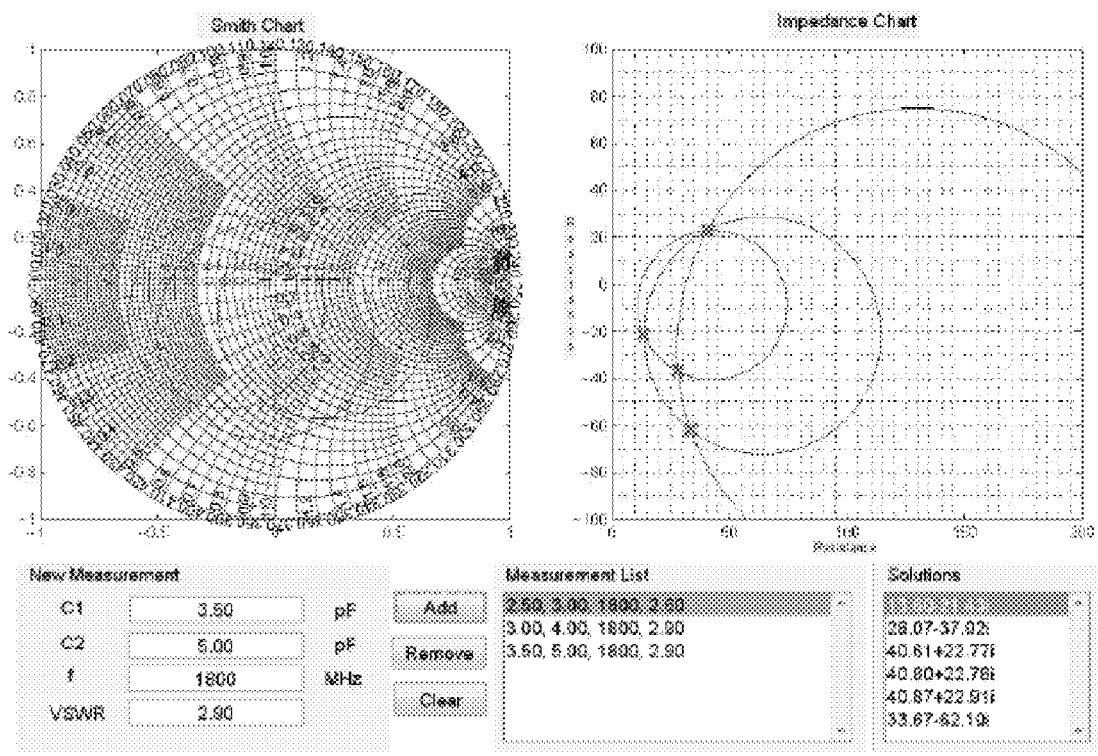

FIG. 10 represents the two solutions obtained by running the process 700 for two sets of power measurements $\eta^{(1)}$ and $\eta^{(2)}$:C1=3.0 pF, C2=4.0 pF, VSWR=2.9:1. In one embodiment, an averaging method can be employed where both solutions are determined to be admissible. For example, as both solutions $Z_A$=13.60−j21.13 and $Z_A$=40.61+j22.77 are admissible, the process 700 can be run for a third measurement set $\eta^{(3)}$:C1=3.5 pF, C2=5.0 pF, VSWR=2.9:1. As illustrated in FIG. 11, the antenna impedance can then be determined as $Z_A$=40.74+j22.83, which is the average of three admissible solutions.

Figure 12:
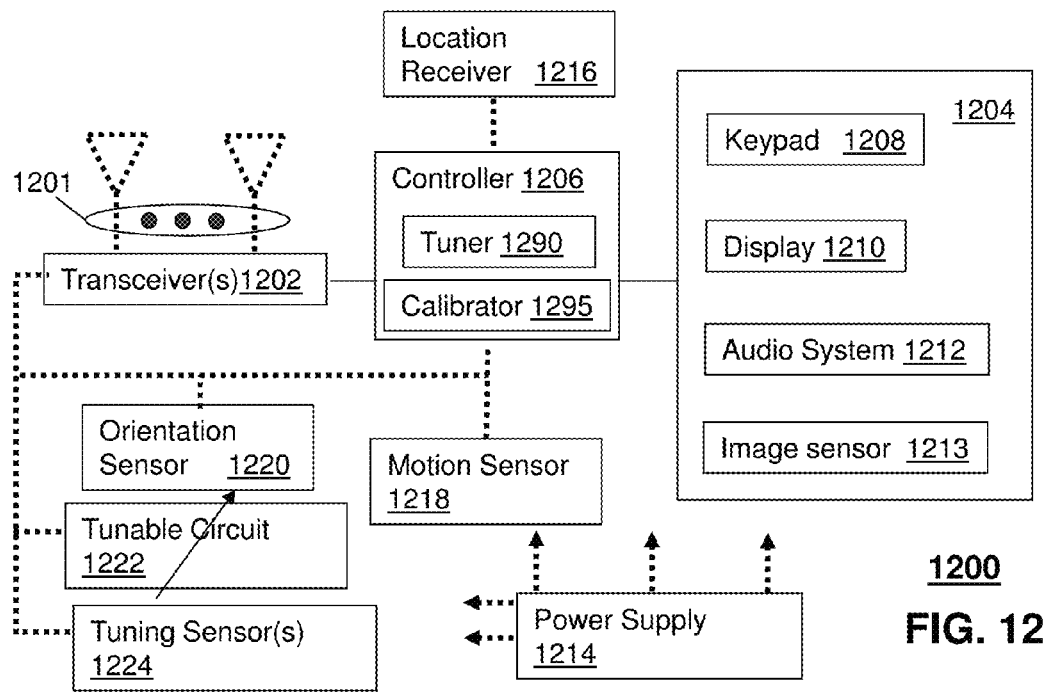
FIG. 12 depicts an illustrative embodiment of a communication device.

FIG. 12 depicts an illustrative embodiment of a communication device 1200 that can implement a calibrated impedance tuning based on antenna impedance calculated from a plurality of measurements. The communication device 1200 can comprise one or more transceivers 1202 coupled to one or more antennas 1201, each transceiver having transmitter and receiver sections (herein transceiver 1202 or transceivers 1202), a tunable circuit 1222, one or more tuning sensors 1224, a user interface (UI) 1204, a power supply 1214, a location receiver 1216, a motion sensor 1218, an orientation sensor 1220, and a controller 1206 for managing operations thereof. The transceiver 1202 can support short-range and/or long-range wireless access technologies such as Bluetooth, ZigBee, Wireless Fidelity (WiFi), Digital Enhance Cordless Telecommunications (DECT), or cellular communication technologies, just to mention a few.

Cellular technologies can include, for example, Global System for Mobile (GSM), Code Division Multiple Access (CDMA), Time Division Multiple Access (TDMA), Universal Mobile Telecommunications (UMTS), World interoperability for Microwave (WiMAX), Software Defined Radio (SDR), Long Term Evolution (LTE), as well as other next generation wireless communication technologies as they arise. The transceiver 1202 can also be adapted to support circuit-switched wireline access technologies such as Public Switched Telephone Network (PSTN), packet-switched wireline access technologies such as TCP/IP, Voice over IP—VoIP, etc., or combinations thereof.

The tunable circuit 1222 can comprise any number of variable reactive elements such as variable capacitors, variable inductors, or combinations thereof that are tunable with digital and/or analog bias signals. The tunable circuit 1222 can include other reactive elements, such as fixed reactive elements, including capacitors and inductors. The tunable circuit 1222 can represent a tunable matching network coupled to the antenna 1201 to compensate for a change in impedance of the antenna 1201, a compensation circuit to compensate for mutual coupling in a multi-antenna system, an amplifier tuning circuit to control operations of an amplifier of the transceiver 1202, a filter tuning circuit to alter a pass band of a filter used by the transceiver 1202, and so on.

Figure 13:
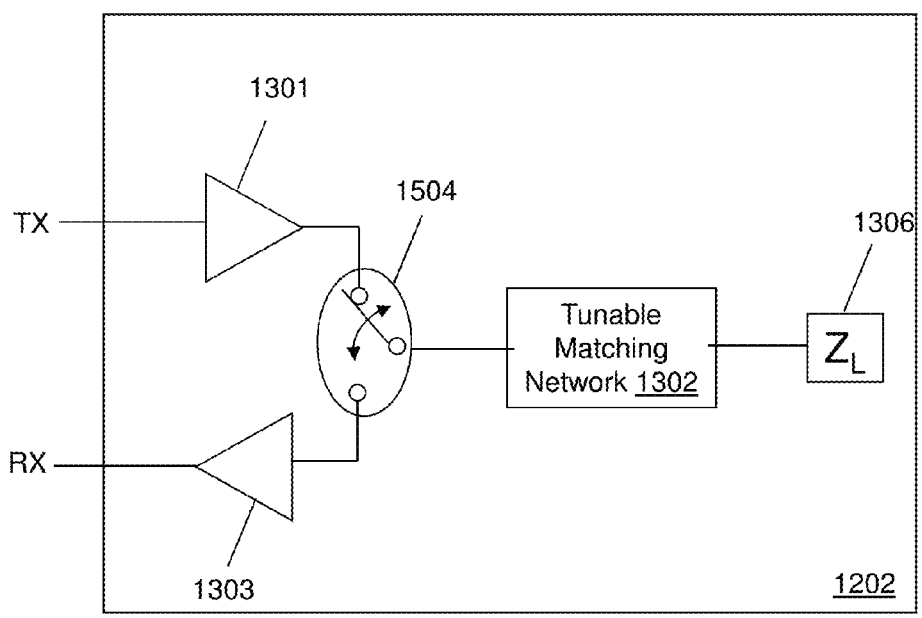
FIG. 13 depicts an illustrative embodiment of a portion of a transceiver of the communication device of FIG. 12.

The tuning sensors 1224 can be placed at any stage of the transceiver 1202 such as, for example, before or after a matching network 1302, and/or at a power amplifier 1301 as shown in FIG. 13. The tuning sensors 1224 can utilize any suitable sensing technology such as directional couplers, voltage dividers, or other sensing technologies to measure signals at any stage of the transceiver 1202. The digital samples of the measured signals can be provided to the controller 1206 by way of analog-to-digital converters included in the tuning sensors 1224. Data provided to the controller 1206 by the tuning sensors 1224 can be used to measure, for example, transmit power, transmitter efficiency, receiver sensitivity, power consumption of the communication device 1200, frequency band selectivity by adjusting filter passbands, linearity and efficiency of power amplifiers, specific absorption rate (SAR) requirements, and so on. The particular type of tuning sensors 1224 and their configuration in the communication device 1200 can depend on the parameters that are being gathered, such as utilizing a directional coupler positioned between the matching network 1302 and the antenna 1306 (in FIG. 13) where forward and reverse power is to be sampled and monitored. The controller 1206 can be configured to execute one or more tuning algorithms, such as based on process 700, to determine desired tuning states of the tunable circuit 1222 based on the foregoing measurements.

The controller 1206 can include an iterative tuner 1290 and a calibrator 1295. These components enable controller 1200 to improve the convergence rate of the tuning algorithm by adjusting the tuning course based on previous tuning runs. Calibrator 1295 can configure the tuning path based on the starting point of the tuning process and a history of successful adjustments. The calibrator 1295 can smooth the tuning path by modifying the tuner step size (adjustment level) based on the results of previous runs. The controller 1206 can also speed up adjustment of tunable elements using an estimate of antenna impedance by increasing the step size of the iterative tuner 1290 in a direction that agrees with the antenna impedance evaluated from previous measurements. Controller 1206 can configure the initial setup associated with different use cases of device 1200 given the actual antenna impedance when the user speaks, types, etc. Controller 1206 can improve the performance of the iterative tuner 1206 by adjusting the triggering and/or stopping conditions based on previous tuning results, such as adjusting (e.g., increasing) the desired VSWR to control the runtime of the tuning algorithm and/or adjusting (e.g., increasing) the maximum acceptable VSWR control unwanted tuning that does not substantially improve the antenna efficiency.

The UI 1204 can include a depressible or touch-sensitive keypad 1208 with a navigation mechanism. The UI 1204 can further include a display 1210 such as monochrome or color LCD (Liquid Crystal Display), OLED (Organic Light Emitting Diode) or other suitable display technology for conveying images to an end user of the communication device 1200. The UI 1204 can also include an audio system 1212 that utilizes audio technology for conveying low volume audio (such as audio heard in proximity of a human ear) and high volume audio (such as speakerphone for hands free operation). The UI 1204 can further include an image sensor 1213 such as a charged coupled device (CCD) camera for capturing still or moving images. The power supply 1214 can utilize common power management technologies such as replaceable and rechargeable batteries, supply regulation technologies, and/or charging system technologies for supplying energy to the components of the communication device 1200 to facilitate long-range or short-range portable applications.

The location receiver 1216 can utilize location technology such as a global positioning system (GPS) receiver. The motion sensor 1218 can utilize motion sensing technology such as an accelerometer, a gyroscope, or other suitable motion sensing technology to detect motion of the communication device 1200 in three-dimensional space. The orientation sensor 1220 can utilize orientation sensing technology such as a magnetometer to detect the orientation of the communication device 1200 (north, south, west, and east, as well as combined orientations in degrees, minutes, or other suitable orientation metrics). The communication device 1200 can use the transceiver 1202 to also determine a proximity to or distance to cellular, WiFi, Bluetooth, or other wireless access points by sensing techniques such as utilizing a received signal strength indicator (RSSI) and/or signal time of arrival (TOA) or time of flight (TOF) measurements.

The controller 1206 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 1200.

Other components not shown in FIG. 12 can be used by the subject disclosure. The communication device 1200 can include a slot for inserting or removing an identity module such as a Subscriber Identity Module (SIM) card. SIM cards can be used for identifying and registering for subscriber services, executing computer programs, storing subscriber data, and so forth.

FIG. 13 depicts an illustrative embodiment of a portion of the wireless transceiver 1202 of the communication device 1200 of FIG. 12. In one embodiment, the transmit and receive portions of the transceiver 1202 can include amplifiers 1301, 1303 coupled to a tunable matching network 1302 that is in turn coupled to an impedance load 1306. The impedance load 1306 in the present illustration can be an antenna as shown in FIG. 12 (herein antenna 1306). A transmit signal in the form of a radio frequency (RF) signal (TX) can be directed to the amplifier 1301 which amplifies the signal and directs the amplified signal to the antenna 1306 by way of the tunable matching network 1302 when switch 1304 is enabled for a transmission session. The receive portion of the transceiver 1202 can utilize a pre-amplifier 1303 which amplifies signals received from the antenna 1306 by way of the tunable matching network 1302 when switch 1304 is enabled for a receive session. Other configurations of FIG. 13 are possible for other types of cellular access technologies such as CDMA, UMTS, LTE, and so forth. These undisclosed configurations are applicable to the subject disclosure.

Figure 14:
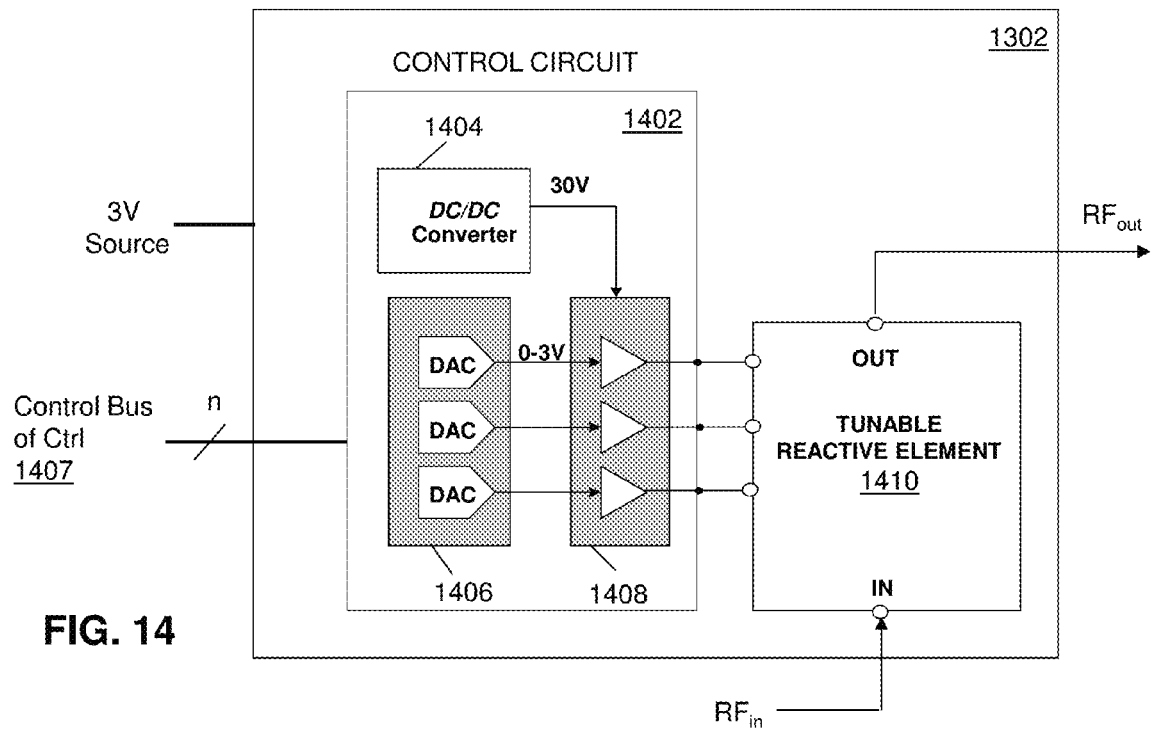
FIGS. 14-17 depict illustrative embodiments of a tunable matching network of the transceiver of FIG. 13.
Figure 15:
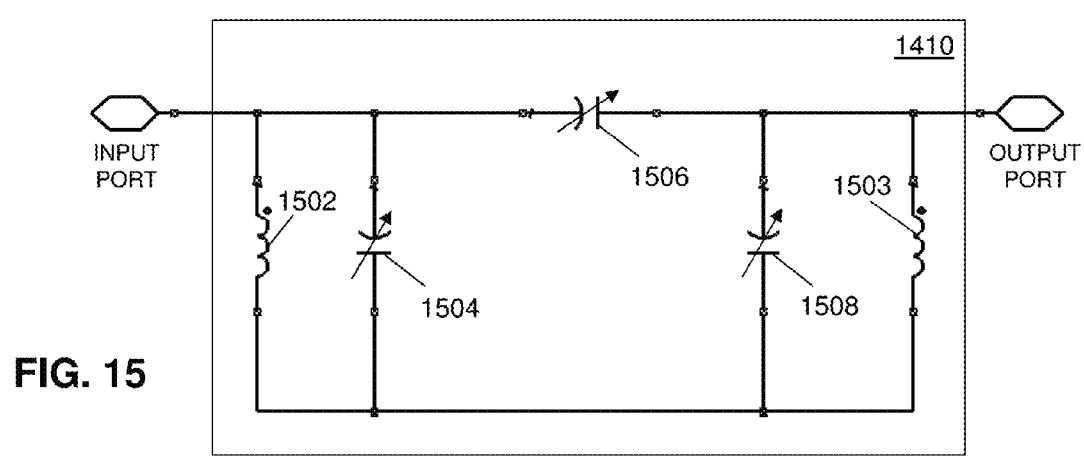

FIGS. 14-15 depict illustrative embodiments of an example of the tunable matching network 1302 of FIG. 13. In one embodiment, the tunable matching network 1302 can include a control circuit 1402 and a tunable reactive element 1410. The control circuit 1402 can comprise a DC-to-DC converter 1404, one or more digital to analog converters (DACs) 1406 and one or more corresponding buffers 1408 to amplify the voltage generated by each DAC. The amplified signal can be fed to one or more tunable reactive components 1504, 1506 and 1508 such as shown in FIG. 15, which depicts a possible circuit configuration for the tunable reactive element 1410. In this illustration, the tunable reactive element 1410 includes three tunable capacitors 1504-1508 and two inductors 1502-1503 with a fixed inductance. Circuit configurations such as "Tee", "Pi", and "L" configurations for a matching circuit are also suitable configurations that can be used in the subject disclosure. The exemplary embodiments can also include other types of configurations for the matching circuit.

The tunable capacitors 1504-1508 can each utilize technology that enables tunability of the reactance of the component. One embodiment of the tunable capacitors 1504-1508 can utilize voltage or current tunable dielectric materials. The tunable dielectric materials can utilize, among other things, a composition of barium strontium titanate (BST). In another embodiment, the tunable reactive element 1410 can utilize semiconductor varactors, and/or MEMS technology capable of mechanically varying the dielectric constant of a capacitor. Other present or next generation methods or material compositions that result in a voltage or current tunable reactive element are applicable to the subject disclosure for use by the tunable reactive element 1410 of FIG. 14.

The DC-to-DC converter 1404 can receive a DC signal such as 3 volts from the power supply 1214 of the communication device 1200 in FIG. 12. The DC-to-DC converter 1404 can use technology to amplify a DC signal to a higher range (e.g., 30 volts) such as shown. The controller 1206 can supply digital signals to each of the DACs 1406 by way of a control bus 1407 of "n" or more wires or traces to individually control the capacitance of tunable capacitors 1504-1508, thereby varying the collective reactive impedance of the tunable matching network 1302. The control bus 1407 can be implemented with a two-wire serial bus technology such as a Serial Peripheral Interface (SPI) bus (referred to herein as SPI bus 1407). With an SPI bus 1407, the controller 1206 can transmit serialized digital signals to configure each DAC in FIG. 14. The control circuit 1402 of FIG. 14 can utilize digital state machine logic to implement the SPI bus 1407, which can direct digital signals supplied by the controller 1206 to the DACs to control the analog output of each DAC, which is then amplified by buffers 1408. In one embodiment, the control circuit 1402 can be a stand-alone component coupled to the tunable reactive element 1410. In another embodiment, the control circuit 1402 can be integrated in whole or in part with another device such as the controller 1206. As described above, the exemplary impedance matching techniques (e.g., method 701 and/or process 700) can improve tuning via calibration of the iterative tuner, including by way of reducing runtime and eliminating tuning that does not provide a desired level of antenna efficiency.

Although the tunable reactive element 1410 is shown in a unidirectional fashion with an RF input and RF output, the RF signal direction is illustrative and can be interchanged. Additionally, either port of the tunable reactive element 1410 can be connected to a feed point of the antenna 1201 or 1306, a structural element of the antenna in an on-antenna configuration, or between antennas for compensating mutual coupling when diversity antennas are used, or when antennas of differing wireless access technologies are physically in close proximity to each other and thereby are susceptible to mutual coupling. The tunable reactive element 1410 can also be connected to other circuit components of a transmitter or a receiver section such as filters, amplifiers, and so on, to control operations thereof.

Figure 16:
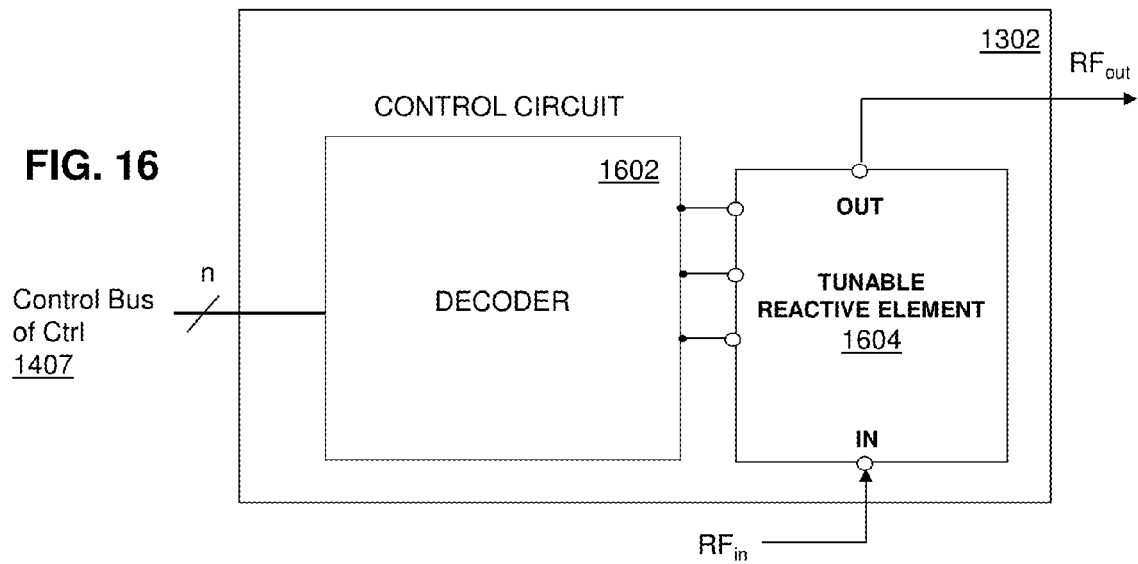
Figure 17:
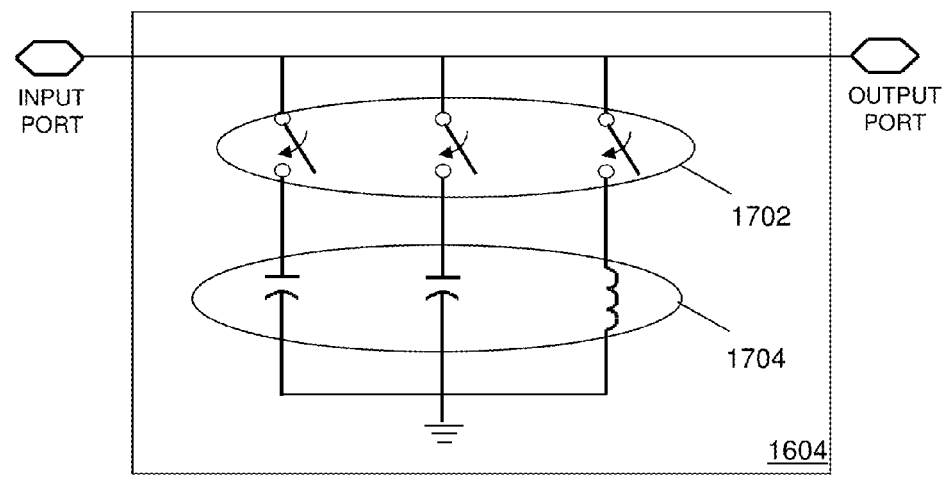

In another embodiment, the tunable matching network 1302 of FIG. 13 can comprise a control circuit 1602 in the form of a decoder and a tunable reactive element 1604 comprising switchable reactive elements such as shown in FIGS. 16-17. In this embodiment, the controller 1206 can supply the control circuit 1602 signals via the SPI bus 1407, which can be decoded with Boolean or state machine logic to individually enable or disable the switching elements 1702. The switching elements 1702 can be implemented with semiconductor switches, MEMS, or other suitable switching technology. By independently enabling and disabling the reactive elements 1704 (capacitor or inductor) of FIG. 17 with the switching elements 1702, the collective reactive impedance of the tunable reactive element 1604 can be varied by the controller 1206.

The tunable reactive elements 1410 and 1604 of FIGS. 14 and 16, respectively, can be used with various circuit components of the transceiver 1202 to enable the controller 1206 to manage performance factors such as, for example, but not limited to, transmit power, transmitter efficiency, receiver sensitivity, power consumption of the communication device 1200, frequency band selectivity by adjusting filter passbands, linearity and efficiency of power amplifiers, SAR requirements, among other operational parameters.

FIG. 18 depicts an illustration of a look-up table 1800 stored in memory, which can be indexed by the controller 1206 of the communication device 1200 of FIG. 12 according to various criteria, such as reflected power, physical and/or functional use cases of the communication device 1200, operating frequencies, and so forth. In one embodiment, table 1800 can include sets of tuning settings (e.g., a tuning state) for the variable reactance elements of a matching network, where the sets are derived from VSWR measurements for average users and/or average communication devices. These tuning settings can further be modified based on actual user and/or actual device data.

Figure 19:
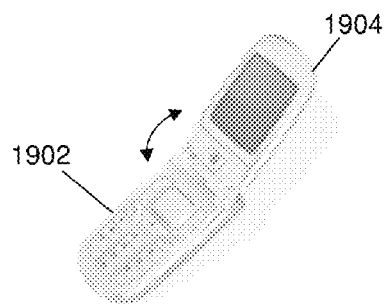
FIGS. 19-22 depict illustrative physical and operational use cases or usage modes of a communication device.

A physical use case can represent a physical state of the communication device 1200, while a functional use case can represent an operational state of the communication device 1200. For example, for a flip phone 1900 of FIG. 19, an open flip can represent one physical use case, while a closed flip can represent another physical use case. In a closed flip state (i.e., bottom and top flips 1902-1904 are aligned), a user is likely to have his/her hands surrounding the top flip 1902 and the bottom flip 1904 while holding the phone 1900, which can result in one range of load impedances experienced by an internal or retrievable antenna (not shown) of the phone 1900. The range of load impedances of the internal or retrievable antenna can be determined by empirical analysis.

With the flip open a user is likely to hold the bottom flip 1902 with one hand while positioning the top flip 1904 near the user's ear when an audio system of the phone 1900, such audio system 1212 of FIG. 14, is set to low volume, and voice channel is active. If, on the other hand, the audio system 1212 is in speakerphone mode, it is likely that the user is positioning the top flip 1904 away from the user's ear. In these arrangements, different ranges of load impedances can be experienced by the internal or retrievable antenna, which can be analyzed empirically. The low and high volume states of the audio system 1212, as well as, a determination that a voice channel is active illustrates varying functional use cases.

Figure 20:
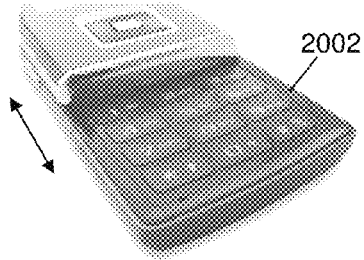
Figure 21:
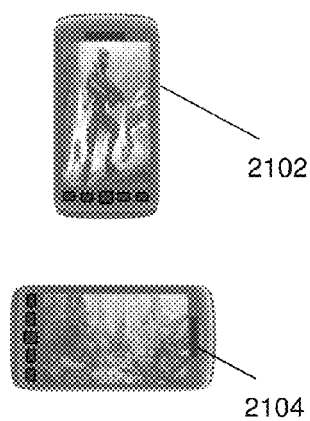
Figure 22:
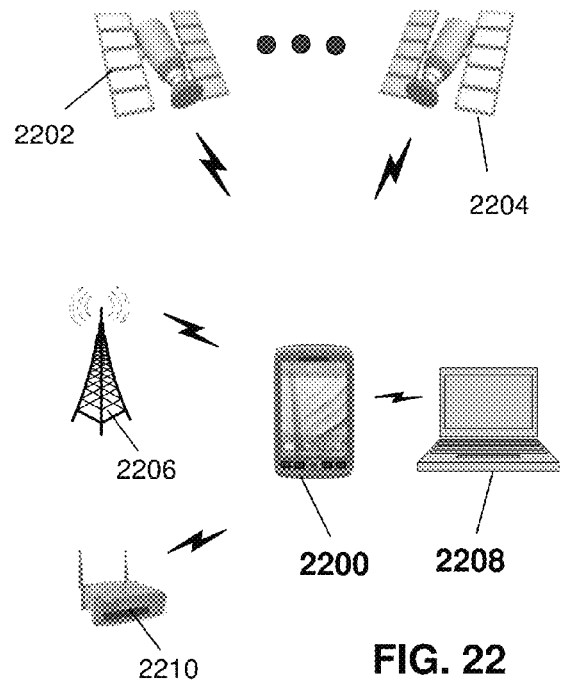

For a phone 2000 with a slideable keypad 2004 (illustrated in FIG. 20), the keypad in an outward position can present one range of load impedances of an internal antenna, while the keypad in a hidden position can present another range of load impedances, each of which can be analyzed empirically. For a smartphone 2200 (illustrated in FIG. 22) presenting a video game, an assumption can be made that the user is likely to hold the phone away from the user's ear in order to view the game. Placing the smartphone 2100 in a portrait position 2102 can represent one physical and operational use case, while utilizing the smartphone 2100 in a landscape position 2104 presents another physical and operational use case.

The number of hands and fingers used in the portrait mode may be determined by the particular type of game being played by the user. For example, a particular video game may require a user interface where a single finger in portrait mode may be sufficient for controlling the game. In this scenario, it may be assumed that the user is holding the smartphone 2100 in one hand in portrait mode and using a finger with the other. By empirical analysis, a possible range of impedances of the internal antenna(s) of the communication device can be determined when using the video game in portrait mode. Similarly, if the video game selected has a user interface that is known to require two hands in landscape mode, another estimated range of impedances of the internal antenna can be determined empirically.

A multimode phone 2200 capable of facilitating multiple access technologies such as GSM, CDMA, LTE, WiFi, GPS, and/or Bluetooth in two or more combinations can provide additional insight into possible ranges of impedances experienced by two or more internal antennas of the multimode phone 2400. For example, a multimode phone 2200 that provides GPS services by processing signals received from a constellation of satellites 2202, 2204 can be empirically analyzed when other access technologies are also in use. Suppose, for instance, that while navigation services are enabled, the multimode phone 2200 is facilitating voice communications by exchanging wireless messages with a cellular base station 2206. In this state, an internal antenna of the GPS receiver may be affected by a use case of a user holding the multimode phone 2200 (e.g., near the user's ear or away from the user's ear). The effect on the GPS receiver antenna and the GSM antenna by the user's hand position can be empirically analyzed.

Suppose in another scenario that the antenna of a GSM transceiver is in close proximity to the antenna of a WiFi transceiver. Further assume that the GSM frequency band used to facilitate voice communications is near the operational frequency of the WiFi transceiver. Also assume that a use case for voice communications may result in certain physical states of the multimode phone 2200 (e.g., slider out), which can result in a probable hand position of the user of the multimode phone 2200. Such a physical and functional use case can affect the impedance range of the antenna of the WiFi transceiver as well as the antenna of the GSM transceiver.

A close proximity between the WiFi and GSM antennas and the near operational frequency of the antennas may also result in cross-coupling between the antennas. Mutual or cross-coupling under these circumstances can be measured empirically. Similarly, empirical measurements of the impedances of other internal antennas can be measured for particular physical and functional use configurations when utilizing Bluetooth, WiFi, Zigbee, or other access technologies in peer-to-peer communications with another communication device 2208 or with a wireless access point 2210. In diversity designs such as multiple-input and multiple output (MIMO) antennas, physical and functional use cases of a communication device can be measured empirically to determine how best to configure a tunable compensation circuit 1222 such as shown in FIG. 12.

The number of physical and functional use cases of a communication device 1200 can be substantial when accounting for combinations of access technologies, frequency bands, antennas of different access technologies, antennas configured for diversity designs, and so on. These combinations, however, can be empirically analyzed to determine load impedances of the antenna(s), mutual coupling between them, and the effects on transmitter and receiver performance metrics. Mitigation strategies to reduce mutual coupling, counter the effect of varying load impedances, and to improve other performance metrics of the transceiver 1202 can also be determined empirically. The empirical data collected and corresponding mitigation strategies can be recorded in the look-up table of FIG. 18 and indexed according to combinations of physical and functional use cases detected by the communication device 1200. The information stored in the look-up table can be used in open-loop RF tuning applications to initialize tunable circuit components of the transceiver 1202, as well as, tuning algorithms that control operational aspects of the tunable circuit components.

It should be understood that devices described in the exemplary embodiments can be in communication with each other via various wireless and/or wired methodologies. The methodologies can be links that are described as coupled, connected and so forth, which can include unidirectional and/or bidirectional communication over wireless paths and/or wired paths that utilize one or more of various protocols or methodologies, where the coupling and/or connection can be direct (e.g., no intervening processing device) and/or indirect (e.g., an intermediary processing device such as a router).

Figure 23:
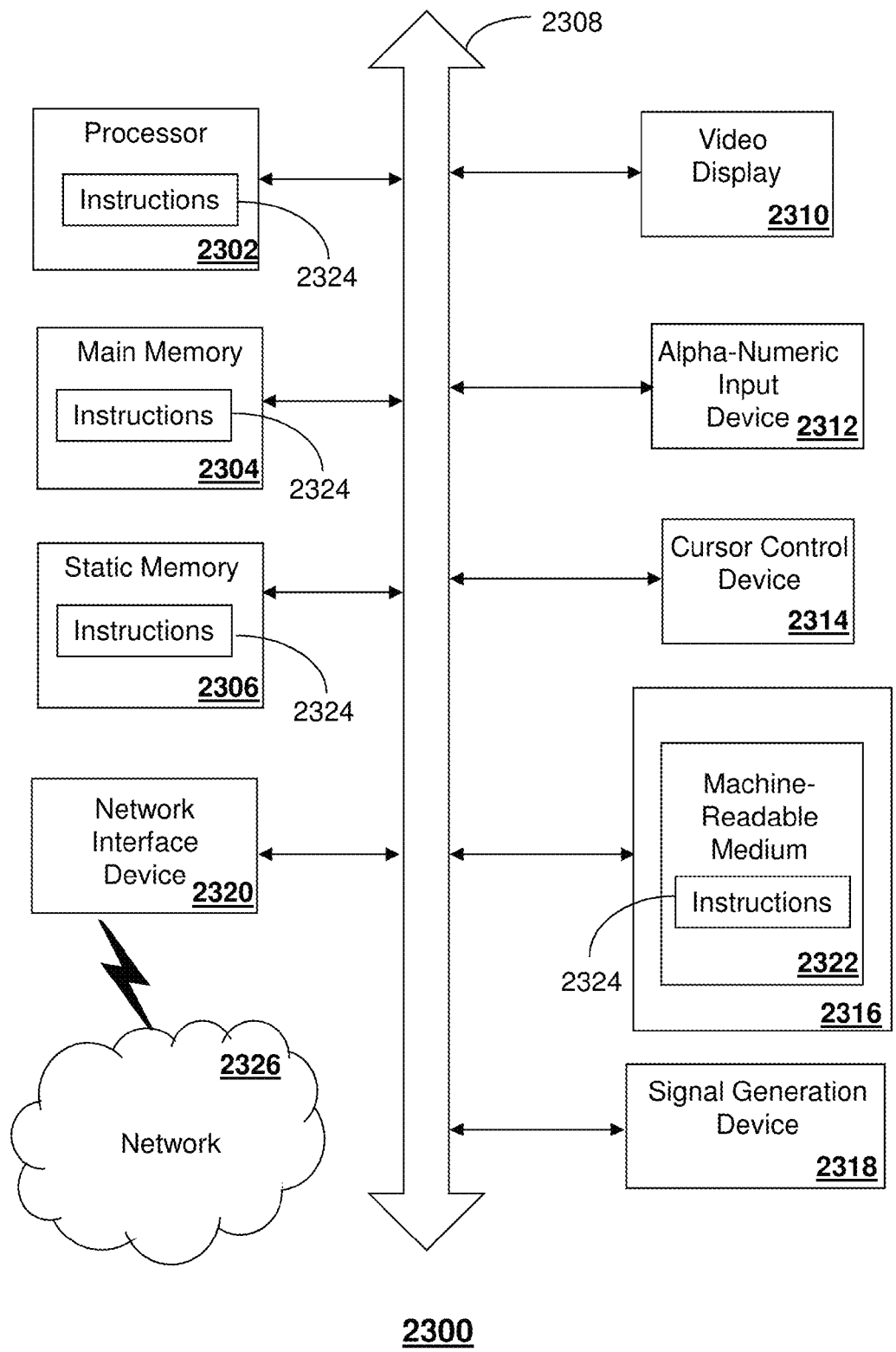
FIG. 23 depicts an illustrative diagrammatic representation of a machine in the form of a computer system within which a set of instructions, when executed, may cause the machine to perform any one or more of the methodologies disclosed herein.

FIG. 23 depicts an exemplary diagrammatic representation of a machine in the form of a computer system 2300 within which a set of instructions, when executed, may cause the machine to perform any one or more of the methods discussed above. One or more instances of the machine can operate, for example, as the communication devices 100 or 1200 of FIGS. 1 and 12, respectively. The machine can enable an iterative tuner to be calibrated, such as based on antenna impedance determined from a plurality of reflected and forward power measurements, such as described with respect to process 700 and method 701.

The machine may comprise a server computer, a client user computer, a personal computer (PC), a tablet PC, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video and/or data communication. Further, while a single machine is illustrated, the term "machine" shall also be taken to include any collection of machines that individually or jointly execute a set (or multiple sets) of instructions to perform any one or more of the methods discussed herein.

The computer system 2300 may include a processor (or controller) 2302 (e.g., a central processing unit (CPU), a graphics processing unit (GPU, or both), a main memory 2304 and a static memory 2306, which communicate with each other via a bus 2308. The computer system 2300 may further include a display unit 2310 (e.g., a liquid crystal display (LCD), a flat panel, or a solid state display. The computer system 2300 may include an input device 2312 (e.g., a keyboard), a cursor control device 2314 (e.g., a mouse), a disk drive unit 2316, a signal generation device 2318 (e.g., a speaker or remote control) and a network interface device 2320. In distributed environments, the embodiments described in the subject disclosure can be adapted to utilize multiple display units 2310 controlled by two or more computer systems 2300. In this configuration, presentations described by the subject disclosure may in part be shown in a first of the display units 2310, while the remaining portion is presented in a second of the display units 2310.

The disk drive unit 2316 may include a tangible computer-readable storage medium 2322 on which is stored one or more sets of instructions (e.g., software 2324) embodying any one or more of the methods or functions described herein, including those methods illustrated above. The instructions 2324 may also reside, completely or at least partially, within the main memory 2304, the static memory 2306, and/or within the processor 2302 during execution thereof by the computer system 2300. The main memory 2304 and the processor 2302 also may constitute tangible computer-readable storage media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

While the tangible computer-readable storage medium 2322 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth, WiFi, Zigbee), and long-range communications (e.g., WiMAX, GSM, CDMA, LTE) are contemplated for use by computer system 2300.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure, including utilizing one or more features from one embodiment in place of or in addition to one or more features of another embodiment(s). One or more of the exemplary embodiments included in the specification and/or recited in whole or in part in the claims describe functions, steps, determinations, calculations and/or other actions being "based on" one or more factors or other criteria, such as a categorized history of previous tuning search paths being generated based on monitoring previous tuning search paths during previous tuning and based on monitoring previous usage modes during the previous tuning, or such as the adjusting of the tuning search path for the tuning of the matching network being based on the categorized history of previous tuning search paths and the usage mode. It should be understood by one of ordinary skill in the art that the term "based on" can be an open-ended term such that one or more other factors may or may not also be a basis for the function, step, determination, calculation and/or other action in addition to the specifically described factor or criteria.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A communication device, comprising:
   an antenna;
   a transceiver coupled with the antenna;
   a matching network including variable reactance elements, wherein the matching network is coupled with the antenna and the transceiver;
   an iterative matching network tuner coupled with the matching network to set the variable reactance elements according to a preset sequential tuning algorithm; and
   a calibrating system coupled with the iterative matching network tuner, wherein the calibrating system performs operations comprising:

calibrating the iterative matching network tuner based on a history of previous tuning processes by monitoring for a solution for antenna impedance based on the solution being derived from a pair of solutions and detecting one of the pair of solutions that is in proximity to a solution point from previous tuning steps;
calibrating the iterative matching network tuner based on usage modes for the communication device; and
calibrating the iterative matching network tuner based on an estimation of the antenna impedance.

2. The communication device of claim 1, wherein the usage modes include user and device states, and wherein the calibrating system performs additional operations comprising:
identifying a usage mode of the communication device; and
running a calibration session that includes:
adjusting a starting point for tuning of the matching network based on a categorized history of previous tuning search paths and based on the usage mode, wherein the categorized history of previous tuning search paths is generated based on monitoring previous tuning search paths during previous tuning and based on monitoring previous usage modes during the previous tuning; and
adjusting a tuning search path for the tuning of the matching network based on the categorized history of previous tuning search paths and the usage mode, wherein the adjusting of the starting point and the adjusting of the tuning search path reduces a tuning search time.

3. The communication device of claim 1, further comprising a power measurement system coupled with the matching network, transceiver and antenna, wherein the calibrating system performs additional operations comprising:
obtaining values of s-parameters for the matching network when the matching network is tuned to two tuning states, wherein the obtaining of the values of the s-parameters includes at least one of computing the values or retrieving the values,
wherein the monitoring for the solution for the antenna impedance is based on reflected power, forward power, and the s-parameters associated with the two tuning states, and
calibrating the iterative matching network tuner based on a calculated solution for the antenna impedance.

4. The communication device of claim 3, wherein the calibrating system adjusts a tuning search path by adjusting a step size for the antenna impedance.

5. The communication device of claim 3, wherein the monitoring for the solution for the antenna impedance includes:
calculating a first group of parameters comprising $a_1$, $b_1$, $c_1$, $d_1$, and calculating a second group of parameters $a_2$, $b_2$, $c_2$, and $d_2$, wherein the first group of parameters are a function of a first reflected power, a first forward power, and the s-parameters of a first tuning state, wherein the second group of parameters are a function of a second reflected power, a second forward power, and the s-parameters of a second tuning state;
calculating a third group of parameters comprising $k_1$ and $k_2$, wherein $k_1=(a_2 b_1 - a_1 b_2)/(a_1 c_2 - a_2 c_1)$, and wherein $k_2=(a_2 d_1 - a_1 d_2)/(a_1 c_2 - a_2 c_1)$;
calculating a fourth group of parameters comprising $l_1$, $l_2$ and $l_3$, wherein $l_1 = a_1(1+k_1^2)$, wherein $l_2 = a_1(2 k_1 k_2) + c_1 k_1 + b_1$, and wherein $l_3 = a_1 k_2^2 + c_1 k_2 + d_1$;
calculating a fifth parameter $\Delta$, wherein $\Delta = l_2^2 - 4 l_1 l_3$;
calculating a sixth parameter $\Gamma_R$ based on $l_1(\Gamma_R)^2 + l_2 \Gamma_R + l_3 = 0$;
calculating a seventh parameter $\Gamma_I$ based on $\Gamma_I = k_1 \Gamma_R + k_2$; and
determining the antenna impedance ($\Gamma_A$) based on $\Gamma_A = \Gamma_R + j\Gamma_I$.

6. The communication device of claim 3, wherein the calibrating system performs additional operations comprising:
obtaining additional values for the s-parameters for the matching network when the matching network is tuned to a new tuning state, wherein the obtaining of the Additional values of the s-parameters includes at least one of computing the additional values or retrieving the additional values;
calculating additional solutions for the antenna impedance based on the reflected power, the forward power, and the s-parameters associated with the new tuning state;
generating an averaged solution by averaging admissible solutions calculated in current and previous tuning states; and
calibrating the iterative matching network tuner based on the averaged solution for the antenna impedance.

7. The communication device of claim 1, wherein the calibrating system performs additional operations comprising:
adjusting a triggering condition and a stopping condition for the tuning based on the history of previous tuning processes.

8. The communication device of claim 1, wherein the calibrating system performs additional operations comprising:
adjusting a desired voltage standing wave ratio (VSWR) based on the history of previous tuning processes.

9. The communication device of claim 1, wherein the calibrating system performs additional operations comprising:
storing tuning data associated with previous tuning of the matching network; and
adjusting a maximum acceptable voltage standing wave ratio (VSWR) based on the history of previous tuning processes.

10. The communication device of claim 1, wherein the usage mode corresponds to at least one of a flip open state, a slider out state, a hand's free operation state, a hand-held operation state, an ear-piece speaker operation state, or a speaker-phone operation state.

11. The communication device of claim 1, wherein the variable reactance elements include voltage tunable dielectric capacitors.

12. The communication device of claim 1, wherein the variable reactance elements include a Micro-Electro-Mechanical Systems (MEMS) varactor, a semiconductor varactor, a MEMS switched reactance component, a semiconductor switched reactance component, or combinations thereof.

13. A method, comprising:
identifying, by a calibrating system of a communication device, a usage mode of the communication device;
calibrating, by the calibrating system, an iterative matching network tuner of the communication device based on a history of previous tuning processes by monitoring for a solution for antenna impedance based on the solution being derived from a pair of solutions and detecting one of the pair of solutions that is in proximity to a solution point from previous tuning steps;
calibrating, by the calibrating system, the iterative matching network tuner based on at least one of a user or device state associated with the identified usage mode of the communication device; and calibrating, by the calibrating system, the iterative matching network tuner based on an estimation of antenna impedance for the communication device.

14. The method of claim 13, wherein the calibrating of the iterative matching network tuner comprises:
adjusting, by the calibrating system, a starting point for tuning of a matching network of the communication device based on a categorized history of previous tuning search paths and based on the identified usage mode, wherein the categorized history of previous tuning search paths is generated based on monitoring previous tuning search paths during previous tuning and based on monitoring previous usage modes during the previous tuning; and
adjusting, by the calibrating system, a tuning search path for the tuning of the matching network based on the categorized history of previous tuning search paths and the identified usage mode.

15. The method of claim 14, comprising:
obtaining values of s-parameters for the matching network when the matching network is tuned to two tuning states, wherein the obtaining of the values is based on at least one of calculating the values or retrieving the values;
wherein the monitoring for the solution for the antenna impedance is based on reflected power, forward power, and the s-parameters associated with the two tuning states, and
responsive to a determination that a solution comprises the pair of solutions:
obtaining additional values of s-parameters for the matching network when the matching network is tuned to a new tuning state, wherein the obtaining of the additional values is based on at least one of computing or retrieving the additional values,
calculating additional solutions based on the reflected power, the forward power, and the s-parameters associated with the new tuning state, and
generating an averaged solution by averaging admissible solutions obtained in current and previous tuning steps.

16. The method of claim 15, comprising increasing a step size based on the averaged solution.

17. The method of claim 14, comprising:
adjusting a desired voltage standing wave ratio (VSWR) based on the categorized history of previous tuning search paths; and
adjusting a maximum acceptable VSWR based on the categorized history of previous tuning search paths.

18. A non-transitory computer-readable storage medium comprising computer instructions which, responsive to being executed by a calibrating system of a communication device, cause the calibrating system to perform operations comprising:
calibrating an iterative matching network tuner of the communication device based on a history of previous tuning processes by monitoring for a solution for antenna impedance based on the solution being derived from a pair of solutions and detecting one of the pair of solutions that is in proximity to a solution point from previous tuning steps;
calibrating the iterative matching network tuner based on usage modes for the communication device; and
calibrating the iterative matching network tuner based on an estimation of antenna impedance.

19. The non-transitory computer-readable storage medium of claim 18, wherein the calibrating of the iterative matching network comprises:
obtaining values of s-parameters for a matching network of the communication device when the matching network is tuned to any two tuning states, wherein the obtaining of the values comprises at least one of calculating the values or retrieving the values,
wherein the monitoring for the solution for the antenna impedance is based on reflected power, forward power, and the s-parameters associated with the two tuning states, and
calibrating the iterative matching network tuner based on a calculated solution for the antenna impedance.

20. The non-transitory computer-readable storage medium of claim 18, wherein the calibrating of the iterative matching network tuner comprises:
identifying at least one of a user state or a device state that corresponds to a usage mode of the communication device; and
executing a calibration session that includes:
accessing a categorized history of previous tuning search paths stored in a memory of the communication device, wherein the categorized history of previous tuning search paths is generated based on monitoring previous tuning search paths during previous tuning and based on monitoring previous usage modes during the previous tuning;
adjusting a starting point for tuning of a matching network of the communication device based on the categorized history of previous tuning search paths and based on at least one of the user or device state; and
adjusting a tuning search path for the tuning of the matching network based on the categorized history of previous tuning search paths and at least one of the user or device state.

* * * * *